(12) United States Patent
Song et al.

(10) Patent No.: US 12,120,935 B2
(45) Date of Patent: Oct. 15, 2024

(54) DISPLAY DEVICE

(71) Applicant: Samsung Display Co., Ltd., Yongin-Si (KR)

(72) Inventors: Inseok Song, Pocheon-si (KR); Gak Seok Lee, Hwaseong-si (KR); Keunchan Oh, Hwaseong-si (KR); Byung-Chul Kim, Yongin-si (KR); Jang Wi Ryu, Yongin-si (KR); Halim Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 268 days.

(21) Appl. No.: 17/381,119

(22) Filed: Jul. 20, 2021

(65) Prior Publication Data

US 2022/0130907 A1 Apr. 28, 2022

(30) Foreign Application Priority Data

Oct. 28, 2020 (KR) ........................ 10-2020-0141476

(51) Int. Cl.
*H10K 59/38* (2023.01)
*H10K 50/86* (2023.01)
*H10K 59/12* (2023.01)
*H10K 71/00* (2023.01)
*H10K 71/50* (2023.01)

(52) U.S. Cl.
CPC ........... *H10K 59/38* (2023.02); *H10K 50/865* (2023.02); *H10K 59/12* (2023.02); *H10K 71/00* (2023.02); *H10K 71/50* (2023.02); *H10K 59/1201* (2023.02)

(58) Field of Classification Search
CPC ....... H10K 59/38; H10K 50/865; H10K 59/12
USPC .................................................. 349/106–109
See application file for complete search history.

(56) References Cited

U.S. PATENT DOCUMENTS

| 2015/0340655 | A1* | 11/2015 | Lee | ...................... | H10K 50/846 |
| | | | | | 257/40 |
| 2018/0156951 | A1 | 6/2018 | Baek et al. | | |
| 2018/0203291 | A1* | 7/2018 | Jung | ................. | G02F 1/133516 |
| 2019/0157354 | A1* | 5/2019 | Lee | ...................... | H10K 59/351 |

(Continued)

FOREIGN PATENT DOCUMENTS

| KR | 10-1555954 B1 | 9/2015 |
| KR | 10-2019-0067955 A | 6/2019 |

(Continued)

*Primary Examiner* — Charles S Chang
(74) *Attorney, Agent, or Firm* — Innovation Counsel LLP

(57) ABSTRACT

A display device includes a first substrate, a pixel structure, a first optical filter, a first-color filter, a second optical filter, a second-color filter, and a second substrate. The pixel structure is disposed between the first substrate and each of the optical filters. The first-color filter is disposed on the first optical filter and has a first refractive index. The second optical filter is spaced from the first optical filter and includes a second-color pigment. The second-color filter is disposed on the second optical filter and has a second refractive index. The second substrate is disposed on the first color filter and the second color filter and has a third refractive index. A difference between the third refractive index and the second refractive index is less than a difference between the third refractive index and the first refractive index.

22 Claims, 24 Drawing Sheets

(56) References Cited

U.S. PATENT DOCUMENTS

| | | | |
|---|---|---|---|
| 2019/0293990 A1 | 9/2019 | Kwon et al. | |
| 2020/0217998 A1* | 7/2020 | Jung | H10K 59/38 |
| 2020/0312916 A1 | 10/2020 | Kim et al. | |
| 2021/0249478 A1* | 8/2021 | Oh | H10K 50/865 |
| 2022/0005875 A1* | 1/2022 | Ahn | H10K 59/353 |
| 2022/0115612 A1* | 4/2022 | Ahn | H10K 50/115 |

FOREIGN PATENT DOCUMENTS

| | | |
|---|---|---|
| KR | 10-2068511 B1 | 1/2020 |
| KR | 10-2020-0032294 A | 3/2020 |
| KR | 10-2020-0040328 A | 4/2020 |

* cited by examiner

FIG. 7
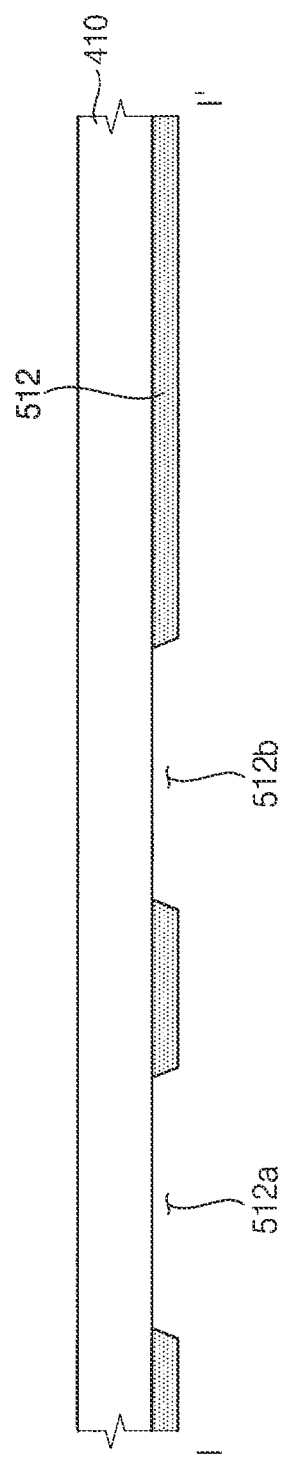
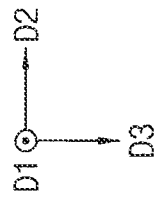

FIG. 8
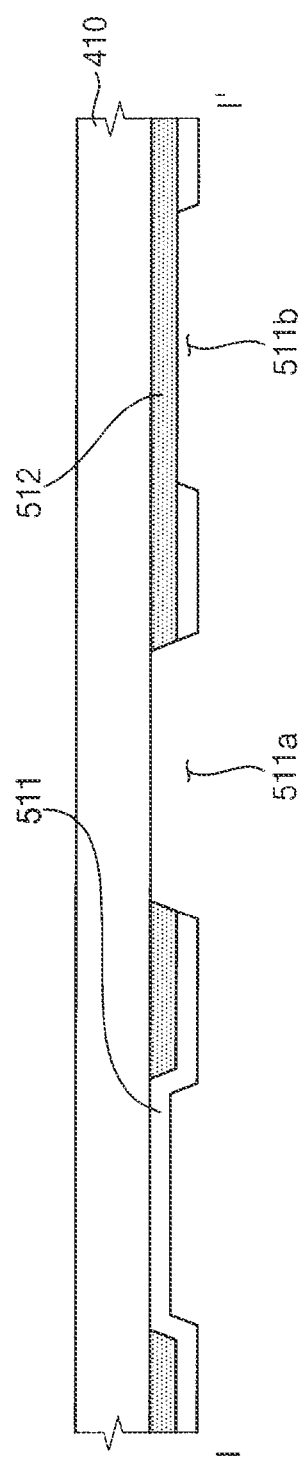
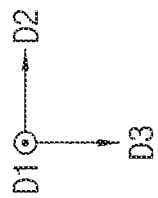

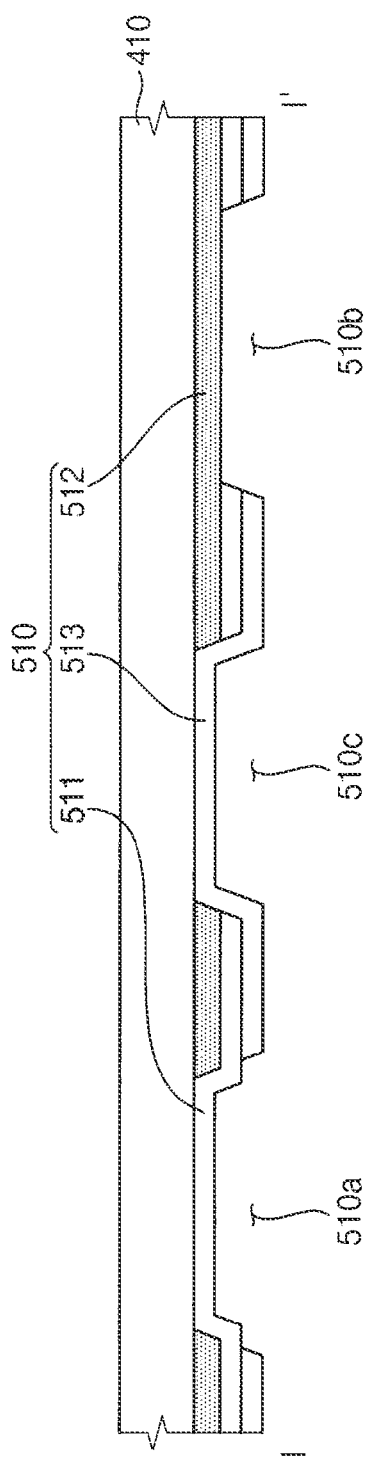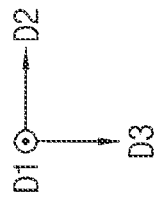

FIG. 12
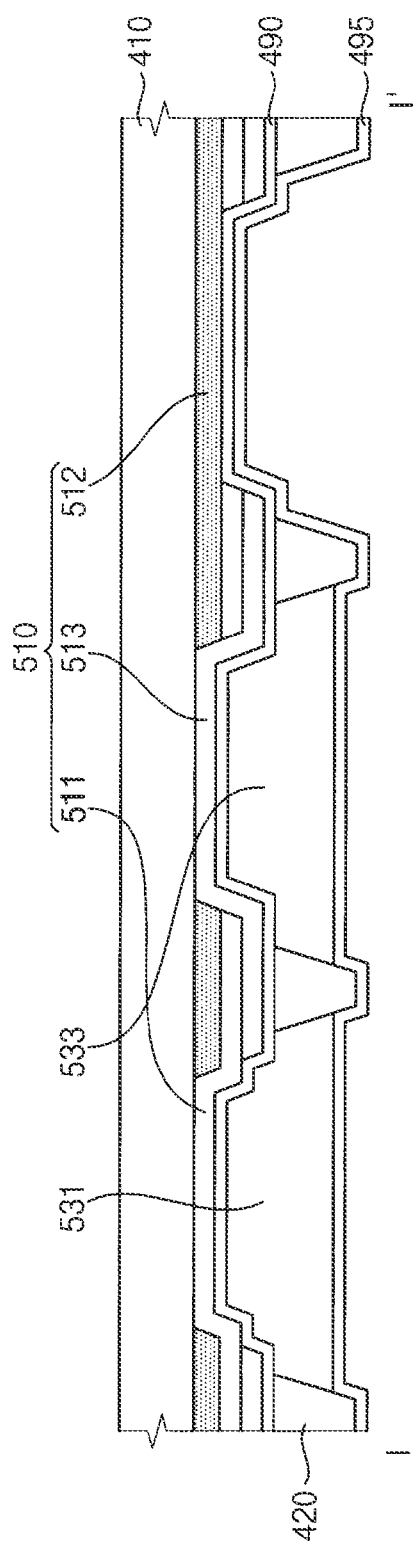
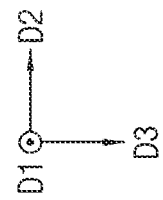

FIG. 13
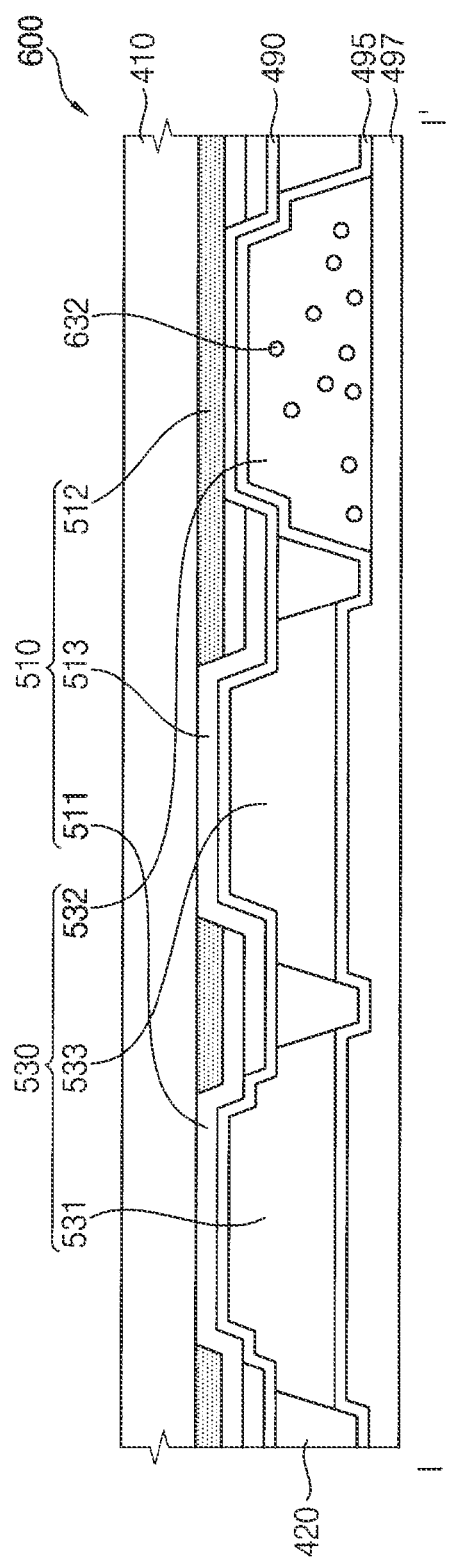
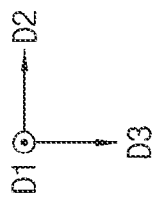

FIG. 16
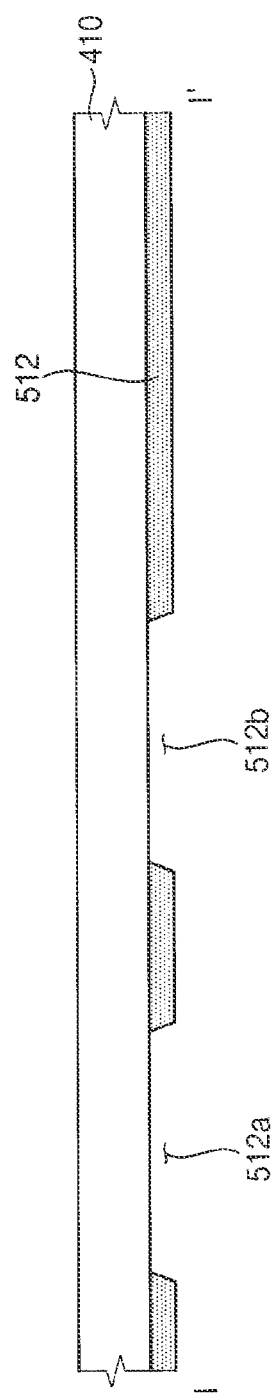
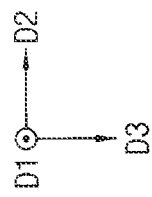

FIG. 18
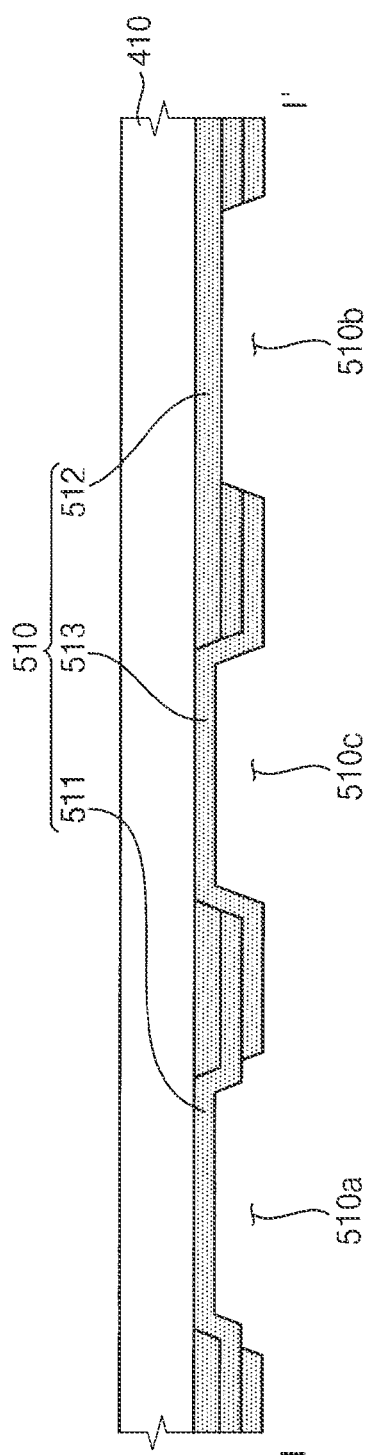
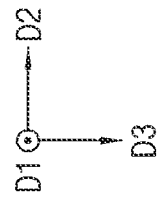

FIG. 19
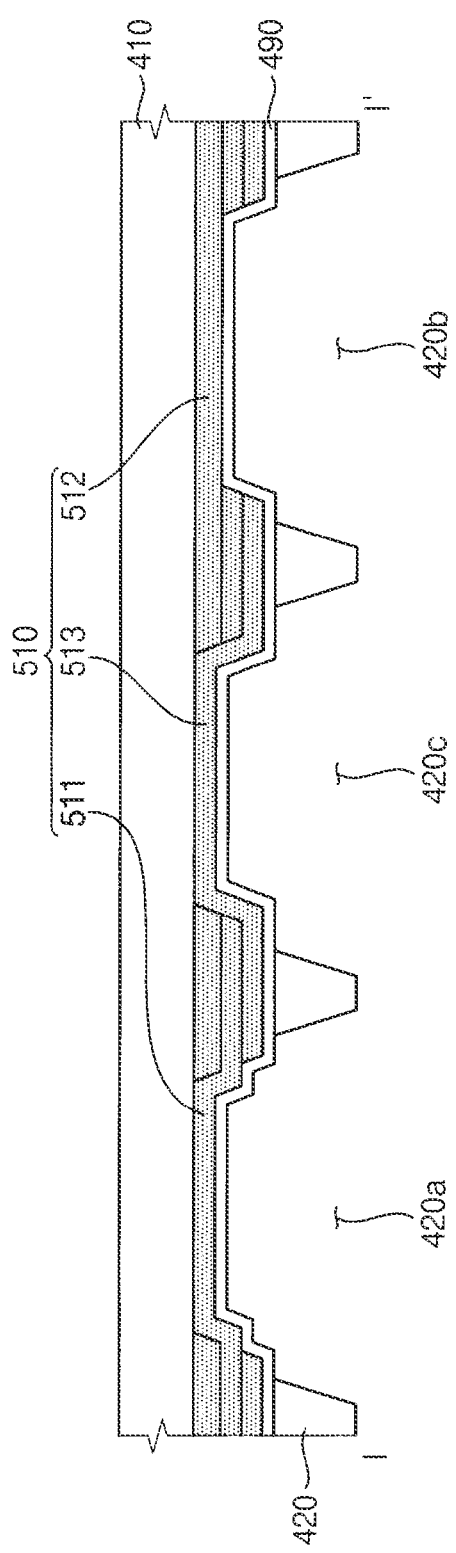
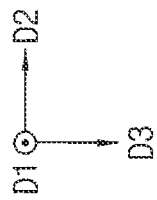

FIG. 21
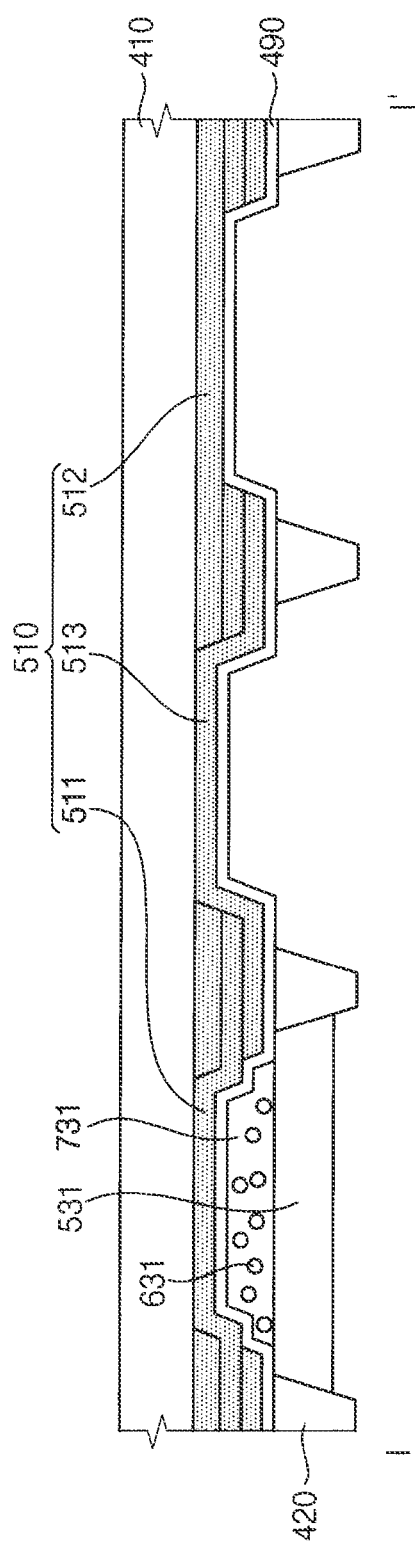
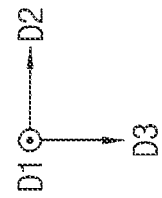

FIG. 23
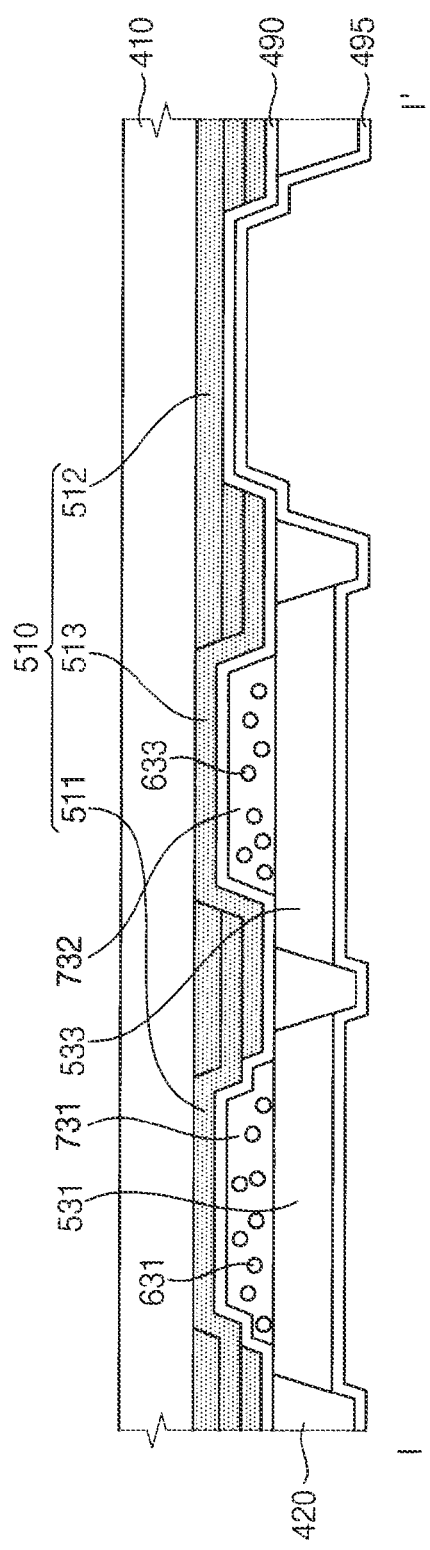
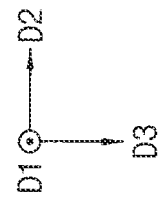

DISPLAY DEVICE

CROSS-REFERENCE TO RELATED APPLICATION

This application claims priority under 35 USC § 119 to Korean Patent Application No. 10-2020-0141476 filed on Oct. 28, 2020 in the Korean Intellectual Property Office (KIPO); the Korean Patent Application is incorporated by reference.

BACKGROUND

1. Field

The technical field relates to a display device.

2. Description of the Related Art

Display devices may display images according to input signals. Modern display devices include liquid crystal display devices and organic light emitting diode display devices.

In order to improve image visibility of a display device, reflection of external light by the display device may be reduced. An overall reflection amount of the external light by the display device may be a sum of specular reflection and scattered/diffuse reflection. If the scattered reflection is reduced, light efficiency of the display device may be undesirably reduced. Therefore, it may be desirable to reduce the specular reflection in order to reduce the overall reflection of the external light by the display device.

SUMMARY

Embodiments may be related to a display device including an optical filter and a color filter. The specular reflection of external light by the display device may be minimized, such that the overall reflection of the external light by the display device may be minimized. Advantageously, image visibility of the display device may be desirable.

According to embodiments, a display device includes a first substrate, a pixel structure, a first optical filter, a first color filter, a second optical filter, a second color filter, and a second substrate. The pixel structure is disposed on the first substrate. The first optical filter is disposed on the pixel structure. The first color filter is disposed on the first optical filter, and has a first color and a first refractive index. The second optical filter is disposed on the pixel structure while being spaced apart from the first optical filter, and includes a pigment having a second color. The second color filter is disposed on the second optical filter, and has the second color and a second refractive index. The second substrate is disposed on the first and second color filters. The second substrate has a third refractive index, and a difference between the third refractive index and the second refractive index is smaller than a difference between the third refractive index and the first refractive index.

The second color may include a blue color.

The second optical filter may have the second color, and the first optical filter may not include a pigment having the first color.

Each of the first and second refractive indexes may be greater than the third refractive index.

When a predetermined amount of the pigment having the second color is added to the second optical filter, a pigment having the second color that constitutes the second color filter may be reduced by an amount corresponding to the predetermined amount of the pigment having the second color. When the pigment having the second color that constitutes the second color filter is reduced by the amount corresponding to the predetermined amount of the pigment having the second color, the refractive index of the second color filter may be reduced.

The display device may further include a third optical filter and a third color filter. The third optical filter may be disposed on the pixel structure while being spaced apart from each of the first and second optical filters. The third color filter may be disposed on the third optical filter, and may have a third color and a fourth refractive index.

The fourth refractive index may be greater than the third refractive index, and the fourth refractive index may be greater than the second refractive index.

The second optical filter may be configured to transmit the second color, and the first optical filter is configured to convert the second color into the first color. The third optical filter may be configured to convert the second color into the third color.

The display device may further include a light blocking member disposed on the pixel structure, and the light blocking member may include a first opening, a second opening, and a third opening. The first optical filter may be disposed in the first opening, and the second optical filter may be disposed in the second opening. The third optical filter may be disposed in the third opening.

The pixel structure may include a first lower electrode disposed under the first optical filter, a second lower electrode disposed under the second optical filter, a third lower electrode disposed under the third optical filter, a light emitting layer disposed on the first, second, and third lower electrodes, and an upper electrode disposed on the light emitting layer.

The second substrate may be disposed on the first to third color filters.

The second color filter may overlap the second optical filter on a bottom surface of the second substrate, and may include first and second openings overlapping portions in which the first optical filter and the third optical filter are disposed, respectively.

The first color filter may be disposed in the first opening of the second color filter, and may include a third opening and a fourth opening. The third opening may overlaps a portion in which the third optical filter is disposed under the second color filter, and may overlap the second opening. The fourth opening may overlap a portion in which the second optical filter is disposed under the second color filter.

The third color filter may be disposed in the second opening of the second color filter and the third opening of the first color filter, and may include a fifth opening and a sixth opening. The fifth opening may overlaps a portion in which the first optical filter is disposed under the first color filter, and may overlap the first opening. The sixth opening may overlap a portion in which the second optical filter is disposed under the first color filter, and may overlap the fourth opening.

The pixel structure may be configured to emit a light having the second color.

According to embodiments, a display device includes a first substrate, a pixel structure, a first optical filter, a first color filter, a first optical filter pattern, a second optical filter, and a second color filter. The pixel structure is disposed on the first substrate. The first optical filter is disposed on the pixel structure. The first color filter is disposed over the first optical filter, and having a first color. The first optical filter pattern is disposed between the first optical filter and the first color filter, and includes a pigment having the first color. The second optical filter is disposed on the pixel structure while being spaced apart from the first optical filter, and includes a pigment having a second color. The second color filter is disposed on the second optical filter, and has the second color.

The display device may further include a third optical filter, a third color filter, and a second optical filter pattern. The third optical filter may be disposed on the pixel structure while being spaced apart from each of the first and second optical filters. The third color filter may be disposed over the third optical filter, and may have a third color. The second optical filter pattern may be disposed between the third optical filter and the third color filter, and may include a pigment having the third color. The first optical filter pattern may have the first color, and the second optical filter pattern may have the third color. The second optical filter may have the second color.

The display device may further include a light blocking member disposed on the pixel structure, and the light blocking member may include a first opening, a second opening, and a third opening. The first optical filter pattern and the first optical filter may be disposed in the first opening, and the second optical filter may be disposed in the second opening. The second optical filter pattern and the third optical filter may be disposed in the third opening.

The display device may further include a second substrate disposed on the first to third color filters. The second color filter may overlap the second optical filter on a bottom surface of the second substrate, and may include first and second openings overlapping portions in which the first optical filter and the third optical filter are disposed, respectively. The first color filter may be disposed in the first opening of the second color filter, and may include a third opening and a fourth opening. The third opening may overlap a portion in which the second optical filter is disposed under the second color filter. The fourth opening may overlap a portion in which the third optical filter is disposed under the second color filter, and may overlap the second opening. The third color filter may be disposed in the second opening of the second color filter and the fourth opening of the first color filter, and may include a fifth opening and a sixth opening. The fifth opening may overlap a portion in which the first optical filter is disposed under the first color filter, and may overlap the first opening. The sixth opening may overlap a portion in which the second optical filter is disposed under the first color filter, and may overlap the third opening. The first optical filter pattern may overlap the first and fifth openings, and the second optical filter pattern may overlap the second and fourth openings.

When a predetermined amount of the pigment having the second color is added to the second optical filter, a pigment having the second color that constitutes the second color filter may be reduced by an amount corresponding to the predetermined amount of the pigment having the second color. When a predetermined amount of the pigment having the first color is added to the first optical filter pattern, a pigment having the first color that constitutes the first color filter may be reduced by an amount corresponding to the predetermined amount of the pigment having the first color. When a predetermined amount of the pigment having the third color is added to the second optical filter pattern, a pigment having the third color that constitutes the third color filter may be reduced by an amount corresponding to the predetermined amount of the pigment having the third color.

An embodiment may be related to a display device. The display device may include a first substrate, a pixel structure, a first optical filter, a first color filter, a second optical filter, a second optical filter, and a second substrate. The pixel structure may be disposed on the first substrate. The first optical filter may be disposed on the pixel structure. The first color filter may be disposed on the first optical filter, may have a first color, and may have a first refractive index. The second optical filter may be disposed on the pixel structure, may be spaced from the first optical filter, and may include a pigment having a second color. The second color filter may be disposed on the second optical filter, may have the second color, and may have a second refractive index. The second substrate may be disposed on the first color filter and the second color filter. The second substrate may have a third refractive index. A difference between the third refractive index and the second refractive index may be less than a difference between the third refractive index and the first refractive index.

The second color may be a blue color.

The second optical filter displays the second color. The first optical filter may not include any pigment having the first color.

Each of the first refractive index and the second refractive index may be greater than the third refractive index.

The pigment having the second color may include a blue pigment and a dye having the second color.

The display device may include the following elements: a third optical filter disposed on the pixel structure and spaced from each of the first optical filter and the second optical filter; and a third color filter disposed on the third optical filter, having a third color, and having a fourth refractive index.

The fourth refractive index may be greater than the third refractive index. The fourth refractive index may be greater than the second refractive index.

The second optical filter may transmit a first part of light of the second color. The first optical filter may convert a second part of the light of the second color into light of the first color. The third optical filter may convert a third part of the light of the second color into light of the third color.

The display device may include a light blocking member disposed on the pixel structure. The light blocking member may include a first hole, a second hole, and a third hole. The first optical filter may be at least partially disposed in the first hole. The second optical filter may be at least partially disposed in the second hole. The third optical filter may be at least partially disposed in the third hole.

The pixel structure may include the following elements: a first pixel electrode disposed between the first optical filter and the first substrate; a second pixel electrode disposed between the second optical filter and the first substrate; a third pixel electrode disposed between the third optical filter and the first substrate; a light emitting layer disposed on the first pixel electrode, the second pixel electrode, and the third pixel electrode; and a common electrode disposed on the light emitting layer.

The second substrate may be disposed directly on the first color filter, the second color filter, and the third color filter.

The second color filter may overlap the second optical filter and may include a first opening and a second opening. The first opening and second opening may respectively expose a first surface portion of the second substrate and a second surface portion of the second substrate that overlap the first optical filter and the third optical filter, respectively.

The first color filter may be partially disposed in the first opening and may include a third opening and a fourth opening. The third opening may expose a portion of the third optical filter that overlaps the second surface portion of the second substrate. The fourth opening may expose a surface portion of the second color filter that overlaps the second optical filter.

The third color filter may be partially disposed in the second opening, may be partially disposed in the third opening, and may include a fifth opening and a sixth opening. The fifth opening may expose a portion of the first optical filter that overlaps the first surface portion of the second substrate. The sixth opening may expose a portion of the second optical filter that overlaps the surface portion of the second color filter.

The pixel structure may emit a light having the second color.

An embodiment may be related to a display device. The display device may include the following elements: a first substrate; a pixel structure disposed on the first substrate; a first optical filter disposed on the pixel structure; a first color filter overlapping the first optical filter and having a first color; a first optical filter member disposed between the first optical filter and the first color filter and including a pigment having the first color; a second optical filter disposed on the pixel structure, spaced apart from the first optical filter, and including a pigment having a second color; and a second color filter disposed on the second optical filter and having the second color.

The display device may include the following elements: a third optical filter disposed on the pixel structure and spaced from each of the first optical filter and the second optical filter; a third color filter overlapping the third optical filter and having a third color; and a second optical filter member disposed between the third optical filter and the third color filter and including a pigment having the third color. The first optical filter member may display the first color. The second optical filter member may display the third color. The second optical filter may display the second color.

The display device may include a light blocking member disposed on the pixel structure. The light blocking member may include a first hole, a second hole, and a third hole. The first optical filter member may be at least partially disposed in the first hole. The second optical filter may be at least partially disposed in the second hole. The second optical filter member may be at least partially disposed in the third hole.

The display device may include a second substrate disposed on the first color filter, the second color filter, and the third color filter. The second color filter may overlap the second optical filter and may include a first opening and a second opening. The first opening and the second opening may respectively expose a first surface portion of the second substrate and a second surface portion of the second substrate that overlap the first optical filter and the third optical filter, respectively. The first color filter may be partially disposed in the first opening and may include a third opening and a fourth opening. The third opening may expose a surface portion of the second color filter that overlaps the second optical filter. The fourth opening may expose a portion of the third optical filter that overlaps the second surface portion of the second substrate. The third color filter may be partially disposed in the second opening, partially disposed in the fourth opening, and may include a fifth opening and a sixth opening. The fifth opening may expose a portion of the first optical filter that overlaps the first surface portion of the second substrate. The sixth opening may expose a portion of the second optical filter that overlaps the surface portion of the second color filter.

At least one of the pigment having the second color, the pigment having the first color, and the pigment having the third color may include a least a dye having at least one of the first color, the second color, and the third color.

A display device according to embodiments may include a second color filter having a refractive index that approximates or is substantially equal to the refractive index of a second substrate, such that the specular reflection of the display device may be minimized. The display device may include a second optical filter including a pigment having the second color, to compensate for the reduced color reproduction rate of the second color. Advantageously, the display device may have minimum specular reflection and may have a desirable color reproduction rate of the second color.

In a display device according to embodiments, in which each of the refractive indexes of the second color filter, the first color filter, and the third color filter may approximate or may be substantially equal to the refractive index of the second substrate, such that the specular reflection of the display device may be minimized. The display device may include a second optical filter including a pigment having the second color, a first optical filter member including a pigment having the first color, and a second optical filter member including a pigment having the third color to compensate for the reduced color reproduction rates of the second color, the first color, and the third color. Advantageously, the display device may have minimum specular reflection and may have a desirable color reproduction rate of each of the first to third colors.

BRIEF DESCRIPTION OF THE DRAWINGS

FIG. 3, FIG. 4, FIG. 5, FIG. 6, FIG. 7, FIG. 8, FIG. 9, FIG. 10, FIG. 11, FIG. 12, FIG. 13, and FIG. 14 are cross-sectional views showing structures of a display device formed in a method of manufacturing the display device according to embodiments.

FIG. 16, FIG. 17, FIG. 18, FIG. 19, FIG. 20, FIG. 21, FIG. 22, FIG. 23, and FIG. 24 are cross-sectional views showing structures of a display device formed in a method of manufacturing the display device according to embodiments.

DETAILED DESCRIPTION OF EMBODIMENTS

Figure 1:
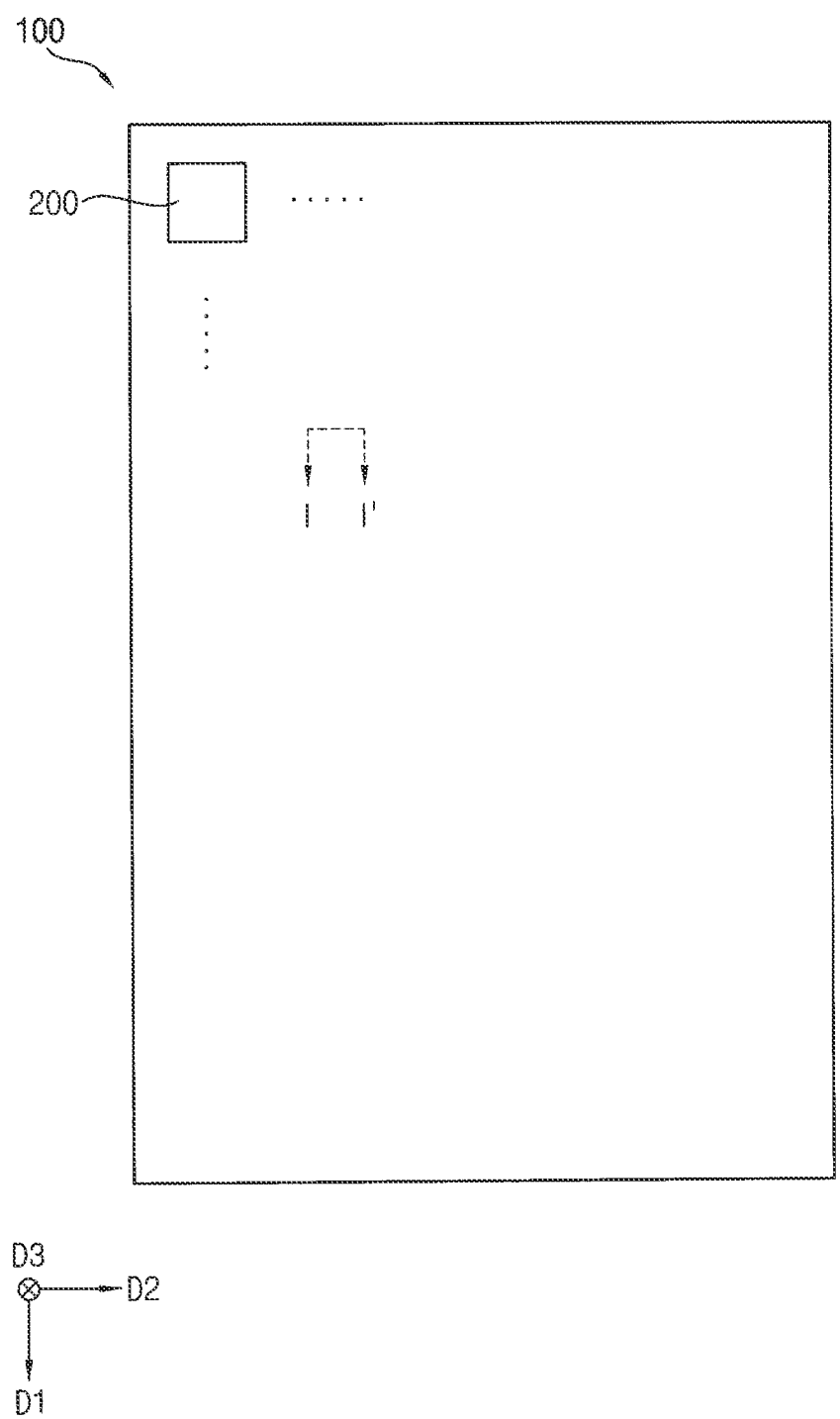
FIG. 1 is a plan view showing a display device according to embodiments.

Embodiments are described with reference to the accompanying drawings. In the accompanying drawings, same or similar reference numerals may refer to the same or similar elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The expression that an opening overlaps an object may mean that the opening exposes the object or the position of the opening overlaps the position of the object. The term "semiconductor element" may mean "transistor" or "switching element." The term "pattern" may mean "member." The term "lower electrode" may mean "pixel electrode." The term "upper electrode" may mean "common electrode." A listing of materials/items may mean at least one of the listed materials/items. The term "include" may mean "be formed/made of." The term "disposed in" may mean "at least partially disposed in/inside." The term "approximately" or "approximating" may mean "in a range of 95% to 105% of." The term "opening" may mean "hole."

Figure 2:
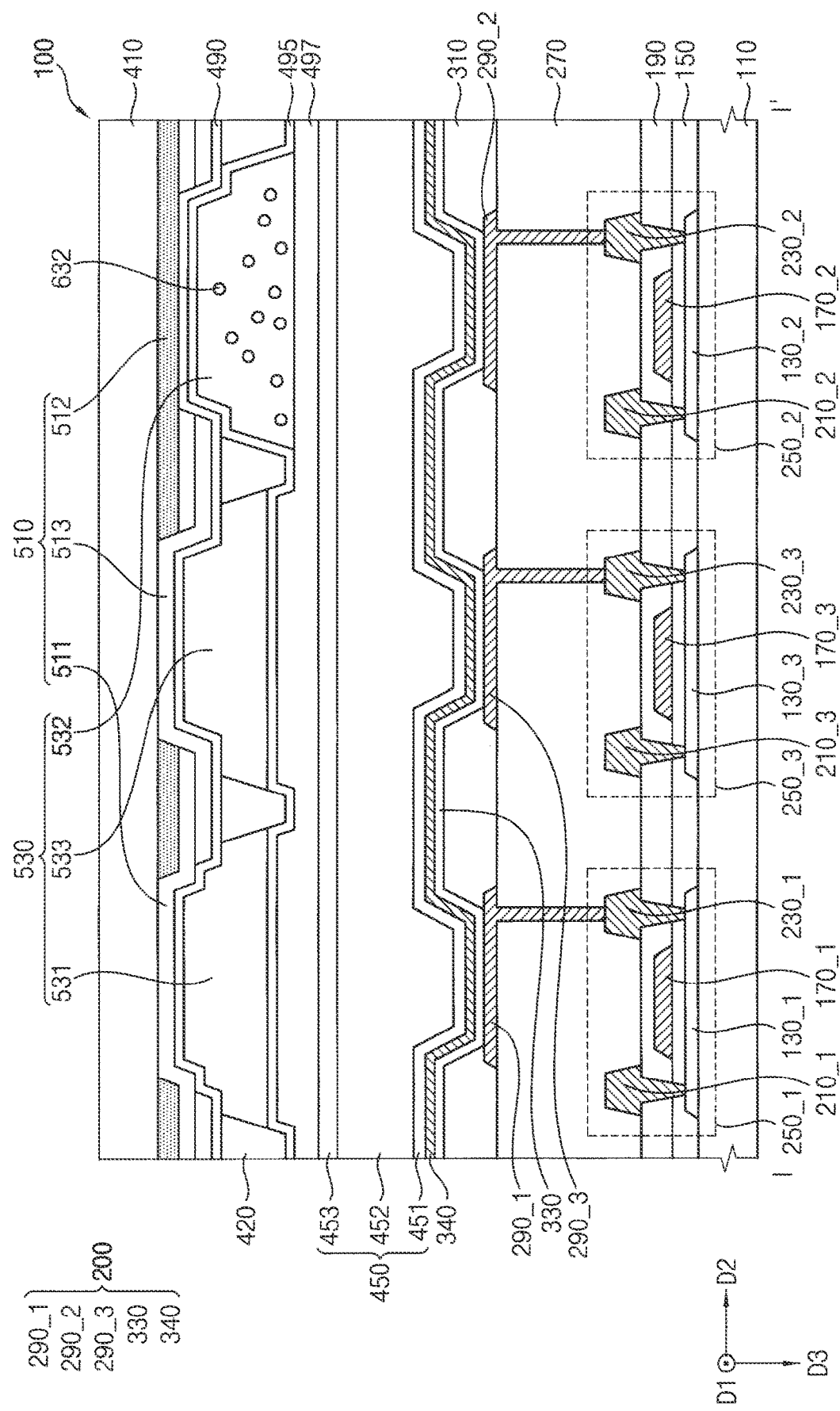
FIG. 2 is a cross-sectional view taken along line I-I' of FIG. 1 according to embodiments.

FIG. 1 is a plan view showing a display device according to embodiments. FIG. 2 is a cross-sectional view taken along line I-I' of FIG. 1 according to embodiments. FIG. 3, FIG. 4, FIG. 5, FIG. 6, FIG. 7, FIG. 8, FIG. 9, FIG. 10, FIG. 11, FIG. 12, FIG. 13, and FIG. 14 are cross-sectional views showing structures of the display device formed in a method of manufacturing the display device according to embodiments.

Referring to FIGS. 1, 2, 6, and 13, a display device 100 may include a lower structure 500 and an upper structure 600. The lower structure 500 and the upper structure 600 may directly contact each other and may be coupled to each other by a sealing member disposed at an outermost periphery of the display device 100. The lower structure 500 and the upper structure 600 may be manufactured independently before being coupled to each other. A pixel structure 200 included in the lower structure 500 may emit light.

The display device 100 may substantially have a rectangular shape, a triangular shape, a rhombic shape, a polygonal shape, a circular shape, a track shape, or an elliptical shape in a plan view.

Figure 6:
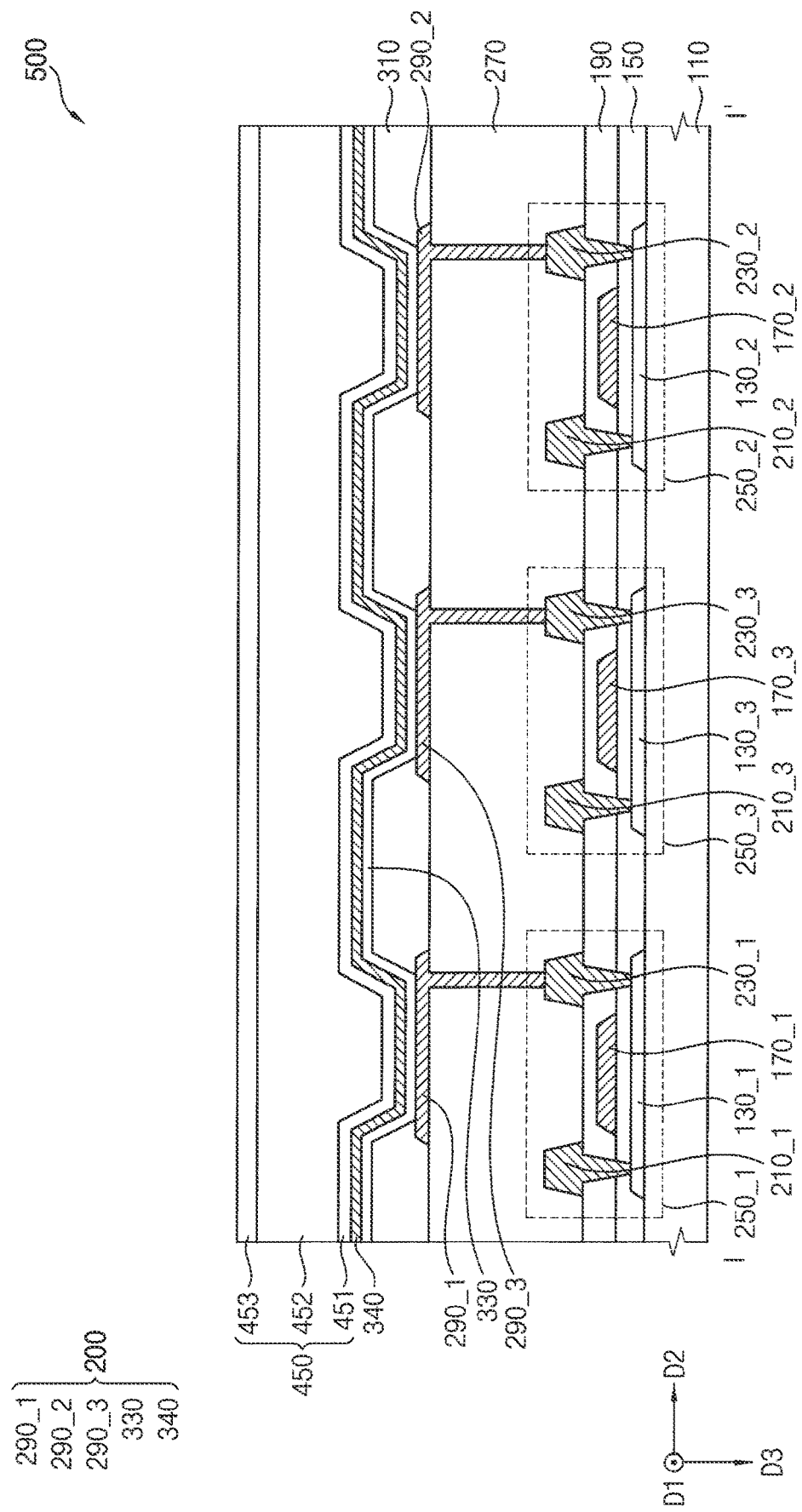

As shown in FIGS. 2 and 6, the lower structure 500 may include a first substrate 110, a first semiconductor element 250_1, a second semiconductor element 250_2, a third semiconductor element 250_3, a gate insulating layer 150, an interlayer insulating layer 190, a planarization layer 270, a pixel structure 200, a pixel defining layer 310, a thin film encapsulation structure 450, and the like. The pixel structure 200 may include a first lower electrode 290_1, a second lower electrode 290_2, a third lower electrode 290_3, a light emitting layer 330, and an upper electrode 340. The first lower electrode 290_1, the light emitting layer 330, and the upper electrode 340 may constitute a first sub-pixel structure; the second lower electrode 290_2, the light emitting layer 330, and the upper electrode 340 may constitute a second sub-pixel structure; the third lower electrode 290_3, the light emitting layer 330, and the upper electrode 340 may constitute a third sub-pixel structure. The first semiconductor element 250_1 may include a first active layer 130_1, a first gate electrode 170_1, a first source electrode 210_1, and a first drain electrode 230_1; the second semiconductor element 250_2 may include a second active layer 130_2, a second gate electrode 170_2, a second source electrode 210_2, and a second drain electrode 230_2; the third semiconductor element 250_3 may include a third active layer 130_3, a third gate electrode 170_3, a third source electrode 210_3, and a third drain electrode 230_3. The thin film encapsulation structure 450 may include a first inorganic thin film encapsulation layer 451, an organic thin film encapsulation layer 452, and a second inorganic thin film encapsulation layer 453.

As shown in FIGS. 2 and 13, the upper structure 600 may include a first protective insulating layer 495, a second protective insulating layer 490, optical filters 530, an intermediate layer 497, color filters 510, a light blocking member 420, a second substrate 410, and the like. The optical filters 530 may include a first optical filter 531 (e.g., a first quantum dot pattern), a second optical filter 532 (e.g., a scattering pattern), and a third optical filter 533 (e.g., a second quantum dot pattern). The color filters 510 may include a first color filter 511, a second color filter 512, and a third color filter 513.

The first color filter 511 may have a first refractive index, the second color filter 512 may have a second refractive index, the second substrate 410 may have a third refractive index, and the third color filter 513 may have a fourth refractive index.

Referring again to FIG. 2, the first substrate 110 may include a transparent or opaque material. The first substrate 110 may include/be a quartz substrate, a synthetic quartz substrate, a calcium fluoride substrate, a fluorine-doped quartz substrate (F-doped quartz substrate), a soda lime glass substrate, a non-alkali glass substrate, and the like.

The first substrate 110 may include/be a transparent resin substrate having flexibility. The first substrate 110 includes a polyimide substrate. The polyimide substrate may have a stacked structure including a first polyimide layer, a barrier film layer, a second polyimide layer, and the like.

A buffer layer may be disposed on the first substrate 110. The buffer layer may be disposed over a whole face of the first substrate 110. The buffer layer may prevent metal atoms or impurities from diffusing from the first substrate 110 to the semiconductor elements and the sub-pixel structures. The buffer layer may control a heat transfer rate during a crystallization process for forming an active layer to obtain a substantially uniform active layer. When a surface of the first substrate 110 is not flat, the buffer layer may provide a substantially flat surface over the first substrate 110. Depending on characteristics of the first substrate 110, at least two buffer layers may be provided on the first substrate 110, or no buffer layer may be provided directly on the first substrate 100. The buffer layer may include an organic insulating material and/or an inorganic insulating material.

The first to third active layers 130_1, 130_2, and 130_3 may be disposed on the first substrate 110 and may be spaced apart from each other. Each of the first to third active layers 130_1, 130_2, and 130_3 may include a metal oxide semiconductor, an inorganic semiconductor (e.g., amorphous silicon or poly silicon), an organic semiconductor, or the like and may include a source region and a drain region.

The gate insulating layer 150 may be disposed on the first to third active layers 130_1, 130_2, and 130_3. The gate insulating layer 150 may cover the first to third active layers 130_1, 130_2, and 130_3 on the first substrate 110 and may be disposed over a whole face of the first substrate 110. The gate insulating layer 150 may sufficiently cover the first to third active layers 130_1, 130_2, and 130_3 on the first substrate 110 and may have a substantially flat top surface without creating a step around the first to third active layers 130_1, 130_2, and 130_3. The gate insulating layer 150 may be disposed along a profile of the first to third active layers 130_1, 130_2, and 130_3 with a uniform thickness to cover the first to third active layers 130_1, 130_2, and 130_3 on the first substrate 110. The gate insulating layer 150 may include a silicon compound, metal oxide, and the like. The gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. The gate insulating layer 150 may have a multilayer structure including a plurality of insulating layers. The insulating layers may have different thicknesses and/or may include different materials.

The first to third gate electrodes 170_1, 170_2, and 170_3 may be disposed on the gate insulating layer 150 and may be spaced apart from each other. The first gate electrode 170_1 may overlap the first active layer 130_1, the second gate electrode 170_2 may overlap the second active layer 130_2, and the third gate electrode 170_3 may overlap the third active layer 130_3. Each of the first to third gate electrodes 170_1, 170_2, and 170_3 may include a metal, an alloy, metal nitride, conductive metal oxide, a transparent conductive material, and the like. For example, each of the first to third gate electrodes 170_1, 170_2, and 170_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These materials may be used alone, or some of the materials may be used in combination. Each of the first to third gate electrodes 170_1, 170_2, and 170_3 may have a multilayer structure including a plurality of metal layers. The metal layers may have different thicknesses and/or may include different materials.

The interlayer insulating layer 190 may be disposed on the first to third gate electrodes 170_1, 170_2, and 170_3. The interlayer insulating layer 190 may sufficiently cover the first to third gate electrodes 170_1, 170_2, and 170_3 and may substantially cover a face of the gate insulating layer 150. The interlayer insulating layer 190 may have a substantially flat top surface without creating a step around the first to third gate electrodes 170_1, 170_2, and 170_3. The interlayer insulating layer 190 may be disposed along a profile of the first to third gate electrodes 170_1, 170_2, and 170_3 with a uniform thickness to cover the first to third gate electrodes 170_1, 170_2, and 170_3 on the gate insulating layer 150. The interlayer insulating layer 190 may include a silicon compound, a metal oxide, and the like. The interlayer insulating layer 190 may have a multilayer structure including a plurality of insulating layers. The insulating layers may have different thicknesses and/or may include different materials.

The first source electrode 210_1, the first drain electrode 230_1, the second source electrode 210_2, the second drain electrode 230_2, the third source electrode 210_3, and the third drain electrode 230_3 may be disposed on the interlayer insulating layer 190 and may be spaced apart from each other. The first source electrode 210_1 may be connected to the source region of the first active layer 130_1 through a contact hole formed in the gate insulating layer 150 and the interlayer insulating layer 190, and the first drain electrode 230_1 may be connected to the drain region of the first active layer 130_1 through a contact hole formed in the gate insulating layer 150 and the interlayer insulating layer 190. The second source electrode 210_2 may be connected to the source region of the second active layer 130_2 through a contact hole formed in the gate insulating layer 150 and the interlayer insulating layer 190, and the second drain electrode 230_2 may be connected to the drain region of the second active layer 130_2 through a contact hole formed in the gate insulating layer 150 and the interlayer insulating layer 190. The third source electrode 210_3 may be connected to the source region of the third active layer 130_3 through a contact hole formed in the gate insulating layer 150 and the interlayer insulating layer 190, and the third drain electrode 230_3 may be connected to the drain region of the third active layer 130_3 through a contact hole formed in the gate insulating layer 150 and the interlayer insulating layer 190. Each of the first to third source electrodes 210_1, 210_2, and 210_3 and the first to third drain electrodes 230_1, 230_2, and 230_3 may include a metal, an alloy, metal nitride, conductive metal oxide, a transparent conductive material, and the like. These may be used alone or in combination. Each of the first to third source electrodes 210_1, 210_2, and 210_3 and the first to third drain electrodes 230_1, 230_2, and 230_3 may have a multilayer structure including a plurality of metal layers. The metal layers may have different thicknesses and/or may include different materials.

The display device 100 may have a plurality of transistors and a plurality of capacitors.

Each of the first to third semiconductor elements 250_1, 250_2, and 250_3 may have a top gate structure, a bottom gate structure, and/or a double gate structure.

Each of the first to third semiconductor elements 250_1, 250_2, and 250_3 may include a portion of the gate insulating layer 150 and a portion of the interlayer insulating layer 190.

The planarization layer 270 may be disposed on the interlayer insulating layer 190 and the first to third semiconductor elements 250_1, 250_2, and 250_3. The planarization layer 270 may be relatively thick to sufficiently cover the first to third source electrodes 210_1, 210_2, and 210_3 and the first to third drain electrodes 230_1, 230_2, and 230_3 on the interlayer insulating layer 190. The planarization layer 270 may have a substantially flat top surface. In order to implement the flat top surface of the planarization layer 270, a planarization process may be performed on the planarization layer 270. The planarization layer 270 may include an organic insulating material, an inorganic insulating material, or the like. The planarization layer 270 may include an organic insulating material.

The first to third lower electrodes 290_1, 290_2, and 290_3 may be disposed on the planarization layer 270 and may be spaced apart from each other. The first to third lower electrodes 290_1, 290_2, and 290_3 may extend through the planarization layer 270 so as to be connected to the first to third drain electrodes 230_1, 230_2, and 230_3, respectively. The first to third lower electrodes 290_1, 290_2, and 290_3 may be electrically connected to the first to third semiconductor elements 250_1, 250_2, and 250_3, respectively. Each of the first to third lower electrodes 290_1, 290_2, and 290_3 may include a metal, an alloy, metal nitride, conductive metal oxide, a transparent conductive material, and the like. These may be used alone or in combination. Each of the first to third lower electrodes 290_1, 290_2, and 290_3 may have a multilayer structure including a plurality of metal layers. The metal layers may have different thicknesses and/or may include different materials.

The pixel defining layer 310 may be disposed on a part of each of the first to third lower electrodes 290_1, 290_2, and 290_3 and the planarization layer 270. The pixel defining layer 310 may cover side portions (e.g., an outer peripheral portion) of each of the first to third lower electrodes 290_1, 290_2, and 290_3, and may expose a part of a top surface of each of the first to third lower electrodes 290_1, 290_2, and 290_3. The pixel defining layer 310 may be formed of an organic insulating material or an inorganic insulating material. The pixel defining layer 310 may include an organic insulating material. The pixel defining layer 310 may include a photoresist, a polyacryl-based resin, a polyimide-based resin, a polyamide-based resin, a siloxane-based resin, an acryl-based resin, an epoxy-based resin, and the like.

The light emitting layer 330 may be disposed on the pixel defining layer 310 and the top surface portion of each of the first to third lower electrodes 290_1, 290_2, and 290_3 exposed by the pixel defining layer 310. The light emitting layer 330 may be continuously arranged on the first substrate 110, and may be integrally formed. The light emitting layer 330 may be formed of a light emitting material for emitting a blue light (e.g., a light having a second color). The light emitting layer 330 may be formed by stacking a plurality of light emitting materials for generating different color lights such as a red light, a green light, and a blue light to emit a white light as a whole.

The upper electrode 340 may be disposed on the pixel defining layer 310 and the light emitting layer 330. The upper electrode 340 may include a metal, an alloy, metal nitride, conductive metal oxide, a transparent conductive material, and the like. These may be used alone or in combination. The upper electrode 340 may have a multilayer structure including a plurality of metal layers. The metal layers may have different thicknesses and/or may include different materials.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the pixel structure 200 from deteriorating due to penetration of moisture, oxygen, and the like. The first inorganic thin film encapsulation layer 451 may perform a function of protecting the pixel structure 200 from an external impact. The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display device 100 and may protect the pixel structure 200. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the pixel structure 200 from deteriorating due to the penetration of moisture, oxygen, and the like together with the first inorganic thin film encapsulation layer 451. The second inorganic thin film encapsulation layer 453 may protect the pixel structure 200 from an external impact together with the first inorganic thin film encapsulation layer 451 and the organic thin film encapsulation layer 452. The second inorganic thin film encapsulation layer 453 may include the inorganic insulating material having flexibility.

The thin film encapsulation structure 450 including the first inorganic thin film encapsulation layer 451, the organic thin film encapsulation layer 452, and the second inorganic thin film encapsulation layer 453 may be disposed between the intermediate layer 497 and the upper electrode 340. The thin film encapsulation structure 450 may have a five-layer structure in which first to fifth thin film encapsulation layers are stacked or a seven-layer structure in which first to seventh thin film encapsulation layers are stacked.

The second substrate 410 may be disposed over the thin film encapsulation structure 450. The second substrate 410 may face (or may be opposite) the first substrate 110. The second substrate 410 and the first substrate 110 may include substantially the same material. The second substrate 410 may include a quartz substrate, a synthetic quartz substrate, a calcium fluoride substrate, a fluorine-doped quartz substrate, a soda lime glass substrate, a non-alkali glass substrate, and the like.

The second color filter 512 may be disposed on a bottom surface of the second substrate 410. The second color filter 512 may be disposed between the second substrate 410 and the second optical filter 532 and may overlap the second optical filter 532. Referring to FIG. 2 and FIG. 7, the second color filter 512 may have openings 512a and 512b. The second color filter 512 may extend in first and second directions D1 and D2, each being perpendicular to the thickness direction D3. The openings 512a and 512b (e.g., first and second openings) may overlap the first optical filter 531 and the third optical filter 533 in portions in which the first optical filter 531 and the third optical filter 533 are located, respectively. The second color filter 512 may transmit a blue light (e.g., light having the second color) and may have/display a blue color (e.g., the second color).

An amount of a pigment having the second color included in the second color filter 512 may be reduced so that the second color filter 512 may have the predetermined second refractive index. The pigment having the second color may include C.I. pigment blue (a blue pigment) and a dye having/displaying the second color.

A total reflection amount of external light by a display device may be a sum of specular reflection and scattered/diffuse reflection. Most of the scattered reflection may correspond to reflection on a quantum dot layer (e.g., optical filters). If the scattered reflection is reduced, light efficiency of the conventional display device may be simultaneously reduced. Therefore, it may be more desirable to reduce the specular reflection in order to reduce the reflection of the external light by the display device. The specular reflection may occur at a top surface of a second substrate that contacts air, an interface between the second substrate and a color filter, an interface between the color filter and a refractive index conversion layer, and the like.

In order to reduce specular reflection at an interface between the second substrate 410 and the second color filter 512, the third refractive index of the second substrate 410 and the second refractive index of the second color filter 512 may be configured such that the third and second refractive indexes may approximate each other or may be substantially equal to each other. The third refractive index (of the second substrate 410) may be approximately 1.52, and a refractive index of a typical color filter is in a range of approximately 1.6 to approximately 1.9. When the second color filter 512 is manufactured by relatively reducing an amount of the pigment (e.g., a predetermined amount of the pigment), light absorptance may be reduced so that the refractive index may be reduced. The third refractive index and the second refractive index may be sufficiently close to each other. Accordingly, the specular reflection at the interface between the second substrate 410 and the second color filter 512 may be reduced.

The first color filter 511 may be disposed (directly) under/on the bottom surface of the second substrate 410 and the second color filter 512. The first color filter 511 may be disposed between the second substrate 410 and the first optical filter 531 and may overlap the first optical filter 531. Referring to FIGS. 2 to 8, the first color filter 511 may have openings 511a and 511b (e.g., third and fourth openings). The first color filter 511 may be disposed in the opening 512a (the first opening) of the second color filter 512, may extend in the first and second directions D1 and D2, may include the opening 511a (the third opening) that exposes the opening 512b (the second opening) of the second color filter 512 (and overlaps the third optical filter 533), and may include the opening 511b (the fourth opening) that exposes a part of a bottom surface of the second color filter 512 (and overlaps the second optical filter 532). The first color filter 511 may transmit a red light (a light having a first color) and may have/display a red color (the first color).

The first refractive index of the first color filter 511 may be in a range of approximately 1.6 to approximately 1.9. Each of the (first and second) refractive indexes of the first and second color filters 511 and 512 may be greater than the (third) refractive index of the second substrate 410. A difference between the (third) refractive index of the second substrate 410 and the (second) refractive index of the second color filter 512 may be less than a difference between the (third) refractive index of the second substrate 410 and the (first) refractive index of the first color filter 511.

The third color filter 513 may be disposed (directly) under/on the bottom surface of the second substrate 410 and the first color filter 511. The third color filter 513 may be disposed between the second substrate 410 and the third optical filter 533 and may overlap the third optical filter 533. The third color filter 513 may be disposed in the opening 512b (the second opening) of the second color filter 512 and the opening 511a (the third opening) of the first color filter 511 (and may overlap the third optical filter 533), may extend in the first and second directions D1 and D2, may include a fifth opening that overlaps the first opening and exposes a part of a bottom surface of the first color filter 511 (and overlaps the first optical filter 531), and may include a sixth opening that overlaps the fourth opening and exposes the opening 511b (the fourth opening) of the first color filter 511 (and overlaps the second optical filter 532). The third color filter 513 may transmit a green light (a light having a third color) and may have/display a green color (the third color).

The (fourth) refractive index of the third color filter 513 may be in a range of approximately 1.6 to approximately 1.9. The (fourth) refractive index of the third color filter 513 may be greater than the (third) refractive index of the second substrate 410, and the (fourth) refractive index of the third color filter 513 may be greater than the (second) refractive index of the second color filter 512.

Referring to FIGS. 7 to 9, the opening 512a of the second color filter 512 and the fifth opening of the third color filter 513 may be defined as a first opening 510a of the color filters 510; the opening 511b of the first color filter 511 and the sixth opening of the third color filter 513 may be defined as a second opening 510b of the color filters 510; the opening 512b of the second color filter 512 and the opening 511a of the first color filter 511 may be defined as a third opening 510c of the color filters 510. The color filters 510 may include a photosensitive resin and/or a color photoresist.

The color filters 510 may include a green color filter, a blue color filter, and a red color filter. The color filters 510 may include a yellow color filter, a cyan color filter, and a magenta color filter.

The arrangement of the color filters may be configured according particular embodiments.

Referring again to FIG. 2, the second protective insulating layer 490 may be disposed under the color filters 510. The second protective insulating layer 490 may cover the color filters 510 on the bottom surface of the second substrate 410. The second protective insulating layer 490 may be disposed along a profile of the color filters 510 with a uniform thickness to cover the color filters 510. The second protective insulating layer 490 may sufficiently cover the color filters 510 on the bottom surface of the second substrate 410 and may have a substantially flat surface without creating a step around the color filters 510. The second protective insulating layer 490 may include an inorganic insulating material and/or an organic insulating material. The second protective insulating layer 490 may include an inorganic insulating material such as silicon nitride. The second protective insulating layer 490 may have a multilayer structure including a plurality of insulating layers. The insulating layers may have different thicknesses and/or may include different materials.

A refractive index conversion layer may be disposed between the second protective insulating layer 490 and the optical filters 530. For example, before a light that has passed through the optical filters 530 passes through the color filters 510, the light may pass through the refractive index conversion layer, and a refractive index of the light may be changed. The refractive index conversion layer may include hollow silica having a predetermined refractive index.

The light blocking member 420 may be disposed on a bottom surface of the second protective insulating layer 490. The light blocking member 420 may be disposed on the pixel structure 200. Referring to FIGS. 2 to 10, the light blocking member 420 may include a first opening 420a, a second opening 420b, a third opening 420c, and light blocking portions. The light blocking portions may overlap a part of the first color filter 511, a part of the second color filter 512, and a part of the third color filter 513, which define the first opening 510a, the second opening 510b, and the third opening 510c. The light blocking member 420 may have a plate shape. The first opening 510a, the second opening 510b, and the third opening 510c of the color filters 510 may overlap the first opening 420a, the second opening 420b, and the third opening 420c of the light blocking member 420, respectively.

The light blocking member 420 may block or absorb a light incident from the outside. The light blocking member 420 may prevent color mixture from occurring in the optical filters 530. For example, if the light blocking member 420 is not present, a part of a light incident onto the third optical filter 533 may be incident onto the first optical filter 531, and the rest of the light may be incident onto the second optical filter 532, such that color mixture may occur.

The light blocking member 420 may include an organic material such as a photoresist, a polyacryl-based resin, a polyimide-based resin, a polyamide-based resin, a siloxane-based resin, an acryl-based resin, and an epoxy-based resin. The light blocking member 420 may be substantially opaque. The light blocking member 420 may further include a light blocking material to absorb the light. The light blocking material may include carbon black, titanium nitride oxide, titanium black, phenylene black, aniline black, cyanine black, nigrosine acid black, a black resin, and the like.

The first optical filter 531 may be disposed in the first opening 420a of the light blocking member 420 and on the bottom surface of the second protective insulating layer 490. The first optical filter 531 may be disposed on the pixel structure 200 and may overlap the first lower electrode 290_1. The first optical filter 531 may overlap the first color filter 511. The first optical filter 531 may be spaced apart from each of the second optical filter 532 and the third optical filter 533 by light blocking portions of the light blocking member 420. The first optical filter 531 may convert a blue light into a red light. The first optical filter 531 may include a plurality of quantum dots configured to absorb a blue light and emit a red light. The first optical filter 531 may not include any pigment (or any dye) having the first color.

The third optical filter 533 may be disposed in the third opening 420c of the light blocking member 420 and on the bottom surface of the second protective insulating layer 490. The third optical filter 533 may be disposed on the pixel structure 200 and may overlap the third lower electrode 290_3. The third optical filter 533 may overlap the third color filter 513. The third optical filter 533 may be spaced apart from each of the first optical filter 531 and the second optical filter 532 by light blocking portions of the light blocking member 420. The third optical filter 533 may convert a blue light into a green light. The third optical filter 533 may include a plurality of quantum dots configured to absorb a blue light and emit a green light. The third optical filter 533 may not include any pigment (or any dye) having the third color.

The quantum dots included in each of the first optical filter 531 and the third optical filter 533 may include at least one of a silicon (Si)-based nanocrystal, a group II-VI-based compound semiconductor nanocrystal, a group III-V-based compound semiconductor nanocrystal, and a group IV-VI-based compound semiconductor nanocrystal. The group II-VI-based compound semiconductor nanocrystal may be one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The group III-V-based compound semiconductor nanocrystal may be one of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI-based compound semiconductor nanocrystal may be SbTe.

Even when the quantum dots included in each of the first optical filter 531 and the third optical filter 533 include the same material, an emission wavelength may vary according to a size of the quantum dots. For example, as the size of the quantum dots decreases, a light having a shorter wavelength may be emitted. Accordingly, a light within a desired visible light region may be emitted by configuring the size(s) of the quantum dots included in each of the first optical filter 531 and the third optical filter 533.

The quantum dots included in the first optical filter 531 and the third optical filter 533 may be formed of the same material, and the size(s) of the quantum dots included in the first optical filter 531 may be greater than the size(s) of the quantum dots included in the third optical filter 533.

The first protective insulating layer 495 may be disposed under the first optical filter 531, the third optical filter 533, the light blocking member 420, and a part of the second protective insulating layer 490. The first protective insulating layer 495 may cover the first optical filter 531, the third optical filter 533, and the light blocking member 420 and may directly contact a bottom surface of the second protective insulating layer 490. The second protective insulating layer 490 and the first protective insulating layer 495 may be spaced apart from each other by each of the first optical filter 531 and the third optical filter 533, and the second protective insulating layer 490 and the first protective insulating layer 495 may directly contact each other through the second opening 420b. The first protective insulating layer 495 may be disposed inside the second opening 420b such that the first protective insulating layer 495 may not be disposed on a bottom surface of the second optical filter 532, and the first protective insulating layer 495 may not be disposed inside the first opening 420a or inside the third opening 420c such that the first protective insulating layer 495 may not be disposed on a top surface of either of the first optical filter 531 and the third optical filter 533. The first protective insulating layer 495 may be disposed along a profile of the first optical filter 531, the second optical filter 532, and the light blocking member 420 with a uniform thickness to cover the first optical filter 531, the second optical filter 532, and the light blocking member 420. The first protective insulating layer 495 may include an inorganic insulating material and/or an organic insulating material. The first protective insulating layer 495 may include an inorganic insulating material such as silicon nitride. The first protective insulating layer 495 may have a multilayer structure including a plurality of insulating layers. The insulating layers may have different thicknesses and/or may include different materials.

The second optical filter 532 may be disposed in the second opening 420b of the light blocking member 420 and on a bottom surface of the first protective insulating layer 495. The second optical filter 532 may be disposed on the pixel structure 200 and may overlap the second lower electrode 290_2. The second optical filter 532 may overlap the second color filter 512. The second optical filter 532 may be spaced apart from each of the first optical filter 531 and the third optical filter 533 by light blocking portions of the light blocking member 420. The second optical filter 532 may transmit a blue light. The second optical filter 532 may include a scattering material for transmitting and displaying a blue light without substantially changing the wavelength of the blue light. The second optical filter 532 may not include quantum dots. Each of the first optical filter 531 and the third optical filter 533 may further include the/a scattering material.

The second optical filter 532 may include TiO, ZrO, AlO$_3$, In$_2$O$_3$, ZnO, SnO$_2$, Sb$_2$O$_3$, ITO, and the like.

The second optical filter 532 may further include a pigment 632 having a second color. The pigment having the second color may include C.I. pigment blue (a blue pigment) and/or a dye having/of the second color (blue). In order to reduce the specular reflection, the second color filter 512 may be manufactured by relatively reducing an amount of the pigment so that the second color filter 512 may have the (relatively low) predetermined second refractive index. However, a color reproduction rate of the second color may also be reduced. In embodiments, if the pigment having the second color that constitutes the second color filter 512 is reduced by a predetermined amount, the predetermined amount of the pigment having the second color may be added to the second optical filter 532. As a result, the second optical filter 532 may have the second color, and a reflectance of the second color may be increased by the pigment having the second color, thereby compensating for the reduced color reproduction rate of the second color.

The sequential arrangement of the first optical filter 531, the third optical filter 533, and the second optical filter 532 may be configured according to particular embodiments and may be different from the arrangement described above.

The intermediate layer 497 may be disposed under the first protective insulating layer 495 and the second optical filter 532. The intermediate layer 497 may be disposed on the bottom surface of the first protective insulating layer 495 to cover the second optical filter 532. The intermediate layer 497 may be relatively thick to sufficiently cover the second optical filter 532. The intermediate layer 497 may be disposed on the thin film encapsulation structure 450. The intermediate layer 497 may include an organic insulating material, an inorganic insulating material, or the like.

The sealing member may be disposed at an outermost periphery of the display device 100 and may be disposed between the first substrate 110 and the second substrate 410. The sealing member may directly contact the bottom surface of the second substrate 410 and a top surface of the first substrate 110. At least one insulating layer (including at least one of the gate insulating layer 150, the interlayer insulating layer 190, the first inorganic thin film encapsulation layer 451, the second inorganic thin film encapsulation layer 453, etc.) may be interposed between a bottom surface of the sealing member and the top surface of the first substrate 110.

The sealing member may include a non-conductive material. The sealing member may include a frit and the like. The sealing member may additionally include a photocurable material. The sealing member may include a mixture of an organic material and a photocurable material, and the sealing member may be obtained by curing the mixture through irradiating the mixture with an ultraviolet (UV) light, a laser light, a visible light, or the like. The photocurable material included in the sealing member may include an epoxy acrylate-based resin, a polyester acrylate-based resin, a urethane acrylate-based resin, a polybutadine acrylate-based resin, a silicon acrylate-based resin, an alkyl acrylate-based resin, and the like.

The mixture of the organic material and the photocurable material may be irradiated with the laser light. Upon the irradiation with the laser light, a state of the mixture may be changed from a solid state to a liquid state, and the mixture in the liquid state may be cured back to the solid state after a predetermined time. According to the change of state of the mixture, the second substrate 410 may be coupled to the first substrate 110.

The display device 100 may be/include an organic light emitting diode display device, a liquid crystal display device (LCD), a field emission display device (FED), a plasma display device (PDP), and/or an electrophoretic display device (EPD). The second substrate 410 on which the optical filters 530, the color filters 510, and the like are disposed may be used as a first/second substrate for at least one of the liquid crystal display device, the field emission display device, the plasma display device, and the electrophoretic display device.

Since the display device 100 according to embodiments includes the second color filter 512 having the second refractive index that is substantially close to the third refractive index of the second substrate 410, the specular reflection of the display device 100 may be minimized. Since the display device 100 includes the second optical filter 532 including the pigment 632 having the second color, the display device 100 may compensate for the reduced color reproduction rate of the second color. Accordingly, the specular reflection of the display device 100 may be minimized, and the color reproduction rate of the display device 100 for the second color may be sufficient.

FIGS. 3 to 14 are cross-sectional views showing structures of a display device formed in a method of manufacturing the display device according to embodiments.

Figure 3:
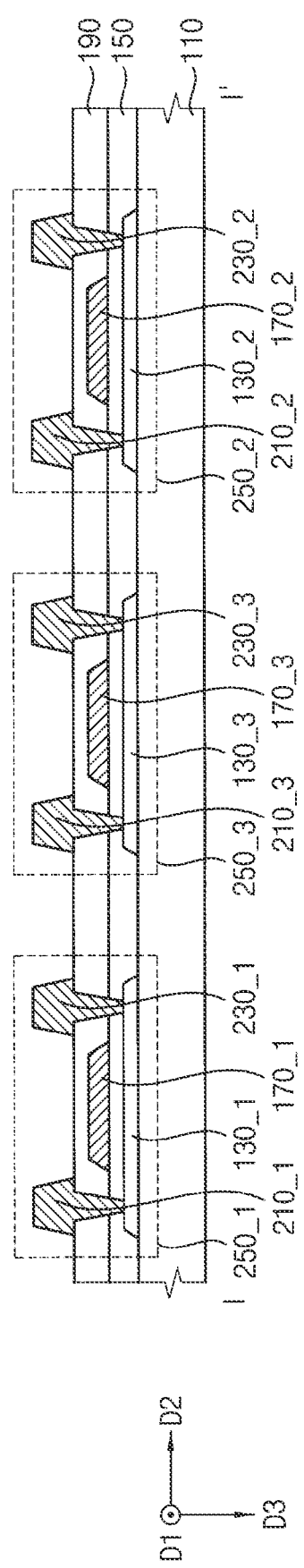

Referring to FIG. 3, a first substrate 110 including a transparent or opaque material may be provided. The first substrate 110 may be/include a quartz substrate, a synthetic quartz substrate, a calcium fluoride substrate, a fluorine-doped quartz substrate, a soda lime glass substrate, a non-alkali glass substrate, and the like. The first substrate 110 may have the third refractive index. The third refractive index may be approximately 1.52.

The first substrate 110 may be a transparent resin substrate having flexibility. An example of the transparent resin substrate that may be used as the first substrate 110 includes a polyimide substrate. The polyimide substrate may include a first polyimide layer, a barrier film layer, a second polyimide layer, and the like. The polyimide substrate may include the first polyimide layer, the barrier film layer, and the second polyimide layer sequentially stacked on a rigid glass substrate. An insulating layer (a buffer layer) may be formed on the second polyimide layer of the polyimide substrate. Semiconductor elements, sub-pixel structures, and the like may be formed on the insulating layer. After the semiconductor elements and the sub-pixel structure are formed, the rigid glass substrate may be removed.

Since the polyimide substrate is thin and flexible, it may be difficult to directly form the semiconductor elements and the sub-pixel structure on the polyimide substrate. The semiconductor elements and the sub-pixel structure may be formed using the rigid glass substrate, and the glass substrate may be removed, so that the polyimide substrate may be used as the first substrate 110.

A buffer layer may be formed on the first substrate 110. The buffer layer may be formed over the whole first substrate 110. Depending on characteristics of the first substrate 110, at least two buffer layers may be provided on the first substrate 110, or the no buffer layer may be formed directly on the first substrate 110. The buffer layer may be formed of an organic material or an inorganic material.

First to third active layers 130_1, 130_2, and 130_3 may be formed on the first substrate 110 and may be spaced apart from each other. Each of the first to third active layers 130_1, 130_2, and 130_3 may be formed of an oxide semiconductor, an inorganic semiconductor, an organic semiconductor, or the like, and may include a source region and a drain region. The first to third active layers 130_1, 130_2, and 130_3 may be simultaneously formed on the same layer using the same material.

A gate insulating layer 150 may be formed on the first to third active layers 130_1, 130_2, and 130_3. The gate insulating layer 150 may cover the first to third active layers 130_1, 130_2, and 130_3 and may be formed over the whole first substrate 110. The gate insulating layer 150 may sufficiently cover the first to third active layers 130_1, 130_2, and 130_3 and may have a substantially flat top surface without creating a step around the first to third active layers 130_1, 130_2, and 130_3. The gate insulating layer 150 may be formed along a profile of the first to third active layers 130_1, 130_2, and 130_3 with a uniform thickness to cover the first to third active layers 130_1, 130_2, and 130_3 on the first substrate 110. The gate insulating layer 150 may be formed of a silicon compound, metal oxide, and the like. The gate insulating layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

First to third gate electrodes 170_1, 170_2, and 170_3 may be formed on the gate insulating layer 150 and may be spaced apart from each other. The first gate electrode 170_1 may be formed on a portion of the gate insulating layer 150 under which the first active layer 130_1 is located, the second gate electrode 170_2 may be formed on a portion of the gate insulating layer 150 under which the second active layer 130_2 is located, and the third gate electrode 170_3 may be formed on a portion of the gate insulating layer 150 under which the third active layer 130_3 is located. Each of the first to third gate electrodes 170_1, 170_2, and 170_3 may be formed of a metal, an alloy, metal nitride, conductive metal oxide, a transparent conductive material, and the like. For example, each of the first to third gate electrodes 170_1, 170_2, and 170_3 may include Au, Ag, Al, Pt, Ni, Ti, Pd, Mg, Ca, Li, Cr, Ta, W, Cu, Mo, Sc, Nd, Ir, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. These may be used alone or in combination. The first to third gate electrodes 170_1, 170_2, and 170_3 may be simultaneously formed on the same layer using the same material.

An interlayer insulating layer 190 may be formed on the first to third gate electrodes 170_1, 170_2, and 170_3. The interlayer insulating layer 190 may cover the first to third gate electrodes 170_1, 170_2, and 170_3 and may be formed over the whole gate insulating layer 150. The interlayer insulating layer 190 may sufficiently cover the first to third gate electrodes 170_1, 170_2, and 170_3 and may have a substantially flat top surface without creating a step around the first to third gate electrodes 170_1, 170_2, and 170_3. The interlayer insulating layer 190 may be formed along a profile of the first to third gate electrodes 170_1, 170_2, and 170_3 with a uniform thickness to cover the first to third gate electrodes 170_1, 170_2, and 170_3 on the gate insulating layer 150. The interlayer insulating layer 190 may be formed of a silicon compound, a metal oxide, and the like.

A first source electrode 210_1, a first drain electrode 230_1, a second source electrode 210_2, a second drain electrode 230_2, a third source electrode 210_3, and a third drain electrode 230_3 may be formed on the interlayer insulating layer 190 and may be spaced apart from each other. The first source electrode 210_1 may be connected to the source region of the first active layer 130_1 through a contact hole formed in the gate insulating layer 150 and the interlayer insulating layer 190; the first drain electrode 230_1 may be connected to the drain region of the first active layer 130_1 through a contact hole formed in the gate insulating layer 150 and the interlayer insulating layer 190. The second source electrode 210_2 may be connected to the source region of the second active layer 130_2 through a contact hole formed in the gate insulating layer 150 and the interlayer insulating layer 190; the second drain electrode 230_2 may be connected to the drain region of the second active layer 130_2 through a contact hole formed in the gate insulating layer 150 and the interlayer insulating layer 190. The third source electrode 210_3 may be connected to the source region of the third active layer 130_3 through a contact hole formed in the gate insulating layer 150 and the interlayer insulating layer 190; the third drain electrode 230_3 may be connected to the drain region of the third active layer 130_3 through a contact hole formed in the gate insulating layer 150 and the interlayer insulating layer 190. Each of the first to third source electrodes 210_1, 210_2, and 210_3 and the first to third drain electrodes 230_1, 230_2, and 230_3 may be formed of a metal, an alloy, metal nitride, conductive metal oxide, a transparent conductive material, and the like. These may be used alone or in combination. The first to third source electrodes 210_1, 210_2, and 210_3 and the first to third drain electrodes 230_1, 230_2, and 230_3 may be simultaneously formed on the same layer using the same material.

Figure 4:
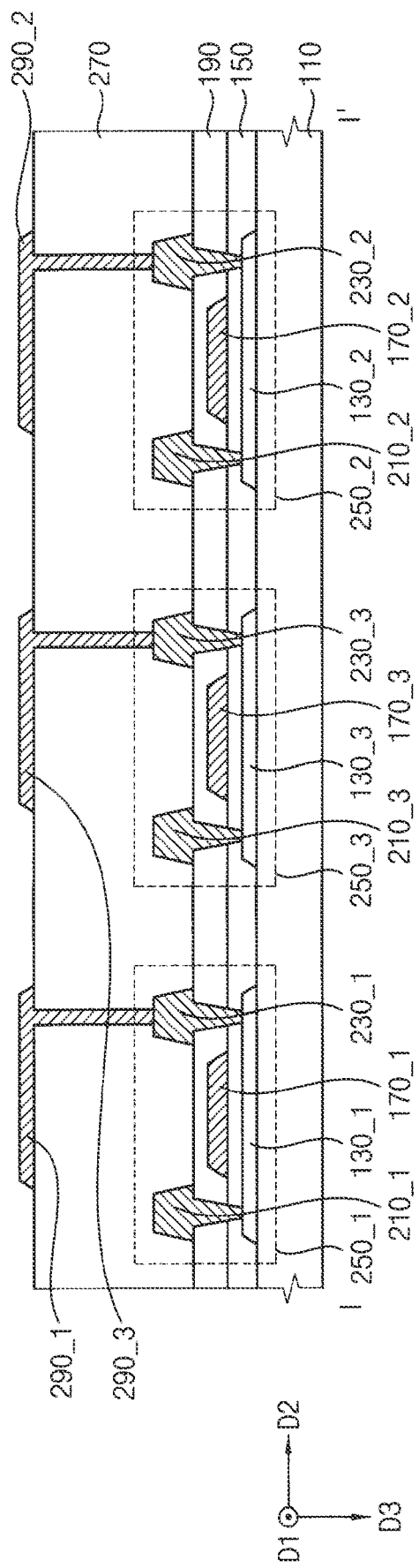

Referring to FIG. 4, a planarization layer 270 may be formed on the interlayer insulating layer 190 and the first to third semiconductor elements 250_1, 250_2, and 250_3. The planarization layer 270 may be sufficiently thick to sufficiently cover the first to third source electrodes 210_1, 210_2, and 210_3 and the first to third drain electrodes 230_1, 230_2, and 230_3. The planarization layer 270 may have a substantially flat top surface. In order to implement the flat top surface of the planarization layer 270, a planarization process may be performed on the planarization layer 270. The planarization layer 270 may be formed of an organic material.

First to third lower electrodes 290_1, 290_2, and 290_3 may be formed on the planarization layer 270 and may be spaced apart from each other. The first to third lower electrodes 290_1, 290_2, and 290_3 may pass through the planarization layer 270 so as to be connected to the first to third drain electrodes 230_1, 230_2, and 230_3, respectively. Each of the first to third lower electrodes 290_1, 290_2, and 290_3 may be formed of a metal, an alloy, metal nitride, conductive metal oxide, a transparent conductive material, and the like. These may be used alone or in combination. The first to third lower electrodes 290_1, 290_2, and 290_3 may be simultaneously formed on the same layer using the same material.

Figure 5:
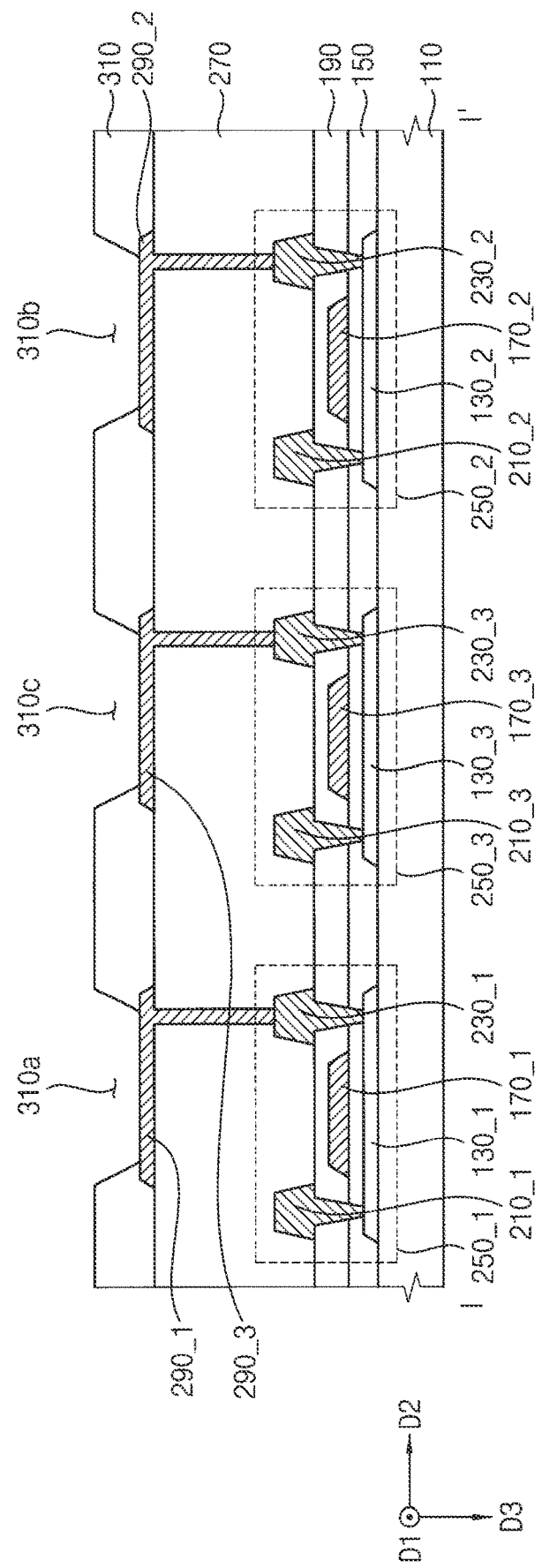

Referring to FIG. 5, a pixel defining layer 310 may be formed on a part of each of the first to third lower electrodes 290_1, 290_2, and 290_3 and the planarization layer 270. The pixel defining layer 310 may cover side portions (an outer peripheral portion) of each of the first to third lower electrodes 290_1, 290_2, and 290_3 and may expose a part of a top surface of each of the first to third lower electrodes 290_1, 290_2, and 290_3. The pixel defining layer 310 may have openings 310a, 310b, and 310c that expose the parts of the top surfaces of the first to third lower electrodes 290_1, 290_2, and 290_3, respectively. The pixel defining layer 310 may be formed of an organic insulating material. The pixel defining layer 310 may include a photoresist, a polyacryl-based resin, a polyimide-based resin, a polyamide-based resin, a siloxane-based resin, an acryl-based resin, an epoxy-based resin, and the like.

Referring to FIG. 6, a light emitting layer 330 may be formed on portions of the first to third lower electrodes 290_1, 290_2, and 290_3 exposed by the pixel defining layer 310 or in the openings 310a, 310b, and 310c. The light emitting layer 330 may be continuously (or integrally) formed on the first substrate 110. The light emitting layer 330 may be formed of a light emitting material for emitting a blue light. The light emitting layer 330 may be formed by stacking a plurality of light emitting materials for generating different color lights such as a red light, a green light, and a blue light to emit a white light as a whole.

The upper electrode 340 may be formed on the pixel defining layer 310 and the light emitting layer 330. The upper electrode 340 may be formed of a metal, an alloy, metal nitride, conductive metal oxide, a transparent conductive material, and the like. These may be used alone or in combination.

A first inorganic thin film encapsulation layer 451 may be formed on the upper electrode 340. The first inorganic thin film encapsulation layer 451 may be formed along a profile of the upper electrode 340 with a uniform thickness to cover the upper electrode 340. The first inorganic thin film encapsulation layer 451 may formed of an inorganic insulating material having flexibility.

An organic thin film encapsulation layer 452 may be formed on the first inorganic thin film encapsulation layer 451. The organic thin film encapsulation layer 452 may be formed of an organic insulating material having flexibility.

A second inorganic thin film encapsulation layer 453 may be formed on the organic thin film encapsulation layer 452. The second inorganic thin film encapsulation layer 453 may be formed along a profile of the organic thin film encapsulation layer 452 with a uniform thickness to cover the organic thin film encapsulation layer 452. The second inorganic thin film encapsulation layer 453 may be formed of the/an inorganic insulating material having flexibility.

Referring to FIG. 7, a second substrate 410 may be provided. The second substrate 410 and the first substrate 110 may include substantially the same material. The second substrate 410 may be/include a quartz substrate, a synthetic quartz substrate, a calcium fluoride substrate, a fluorine-doped quartz substrate, a soda lime glass substrate, a non-alkali glass substrate, and the like. One or more structures shown in one or more of FIGS. 7 to 13 may be inverted in one or more process steps in the manufacturing method.

A second color filter 512 may be formed on a (bottom) surface of the second substrate 410. The second color filter 512 may have openings 512a and 512b. The second color filter 512 may be a color filter configured to transmit a blue light (a light having a second color) and having a blue color (the second color).

An amount of a pigment having the second color included in the second color filter 512 may be reduced (by a predetermined amount) so that the second color filter 512 may have a (predetermined) second refractive index. Accordingly, the third refractive index of the second substrate 410 and the second refractive index of the second color filter 512 may be substantially close/equal to each other. The pigment having the second color may include C.I. pigment blue (a blue pigment) and/or a dye having the second color.

Referring to FIG. 8, a first color filter 511 may be formed on the bottom surface of the second substrate 410 and the second color filter 512. The first color filter 511 may have openings 511a and 511b. The first color filter 511 may transmit a red light (a light having a first color) and may have/display a red color (the first color).

The first color filter 511 may have a first refractive index in a range of approximately 1.6 to approximately 1.9. The first refractive index of the first color filter 511 may be greater than the second refractive index of the second color filter 512.

Referring to FIG. 9, a third color filter 513 may be formed on the bottom surface of the second substrate 410 and the first color filter 511. The third color filter 513 may have a sixth opening that exposes the opening 511b of the first color filter 511 and may include a fifth opening that exposes a part of a bottom surface of the first color filter 511 under the first color filter 511. The third color filter 513 may transmit a green light and may have/display a green color.

The third color filter 513 may have a fourth refractive index in a range of approximately 1.6 to approximately 1.9. Each of the first refractive index of the first color filter 511 and the fourth refractive index of the third color filter 513 may be greater than the second refractive index of the second color filter 512.

The opening 512a of the second color filter 512 and the fifth opening of the third color filter 513 may be defined as a first opening 510a of the color filters 510, the opening 511b of the first color filter 511 and the sixth opening of the third color filter 513 may be defined as a second opening 510b of the color filters 510, and the opening 512b of the second color filter 512 and the opening 511a of the first color filter 511 may be defined as a third opening 510c of the color filters 510. The color filters 510 may be formed of a photosensitive resin or a color photoresist.

Figure 10:
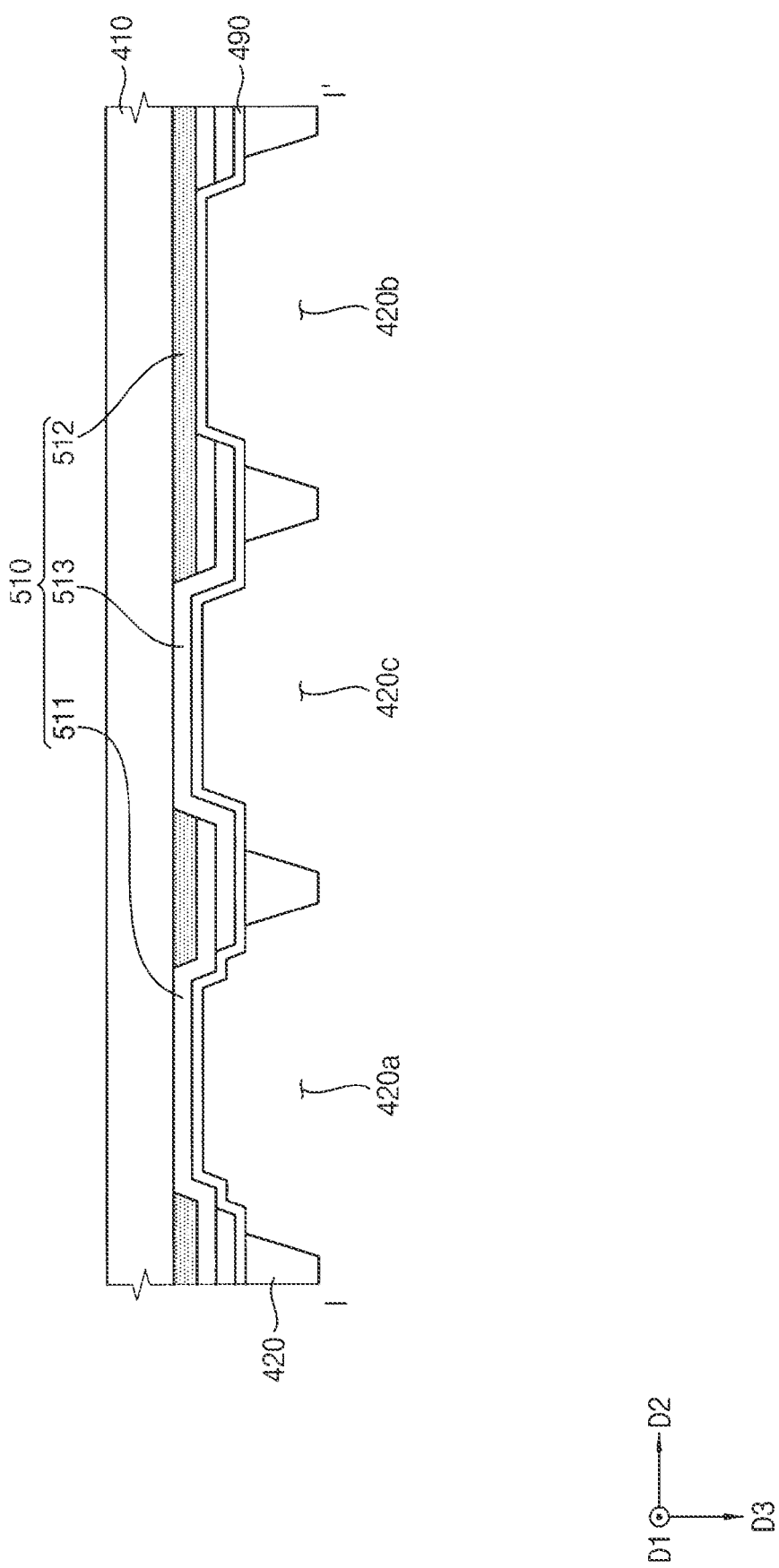

Referring to FIG. 10, a second protective insulating layer 490 may be formed on the color filters 510. The second protective insulating layer 490 may cover the color filters 510. The second protective insulating layer 490 may be formed along a profile of the color filters 510 with a uniform thickness to cover the color filters 510. The second protective insulating layer 490 may sufficiently cover the color filters 510 and may have a substantially flat top surface without creating a step around the color filters 510. The second protective insulating layer 490 may be formed of an inorganic insulating material such as silicon nitride.

A light blocking member 420 may be formed on a bottom surface of the second protective insulating layer 490. The light blocking member 420 may have a first opening 420a, a second opening 420b, and a third opening 420c. The light blocking member 420 may have a plate shape. The first opening 510a, the second opening 510b, and the third opening 510c of the color filters 510 may overlap the first opening 420a, the second opening 420b, and the third opening 420c of the light blocking member 420, respectively. The light blocking member 420 may be formed of an organic material such as a photoresist, a polyacryl-based resin, a polyimide-based resin, a polyamide-based resin, a siloxane-based resin, an acryl-based resin, and an epoxy-based resin. The light blocking member 420 may be substantially opaque. The light blocking member 420 may further include a light blocking material to absorb the light. The light blocking material may include carbon black, titanium nitride oxide, titanium black, phenylene black, aniline black, cyanine black, nigrosine acid black, a black resin, and the like.

Figure 11:
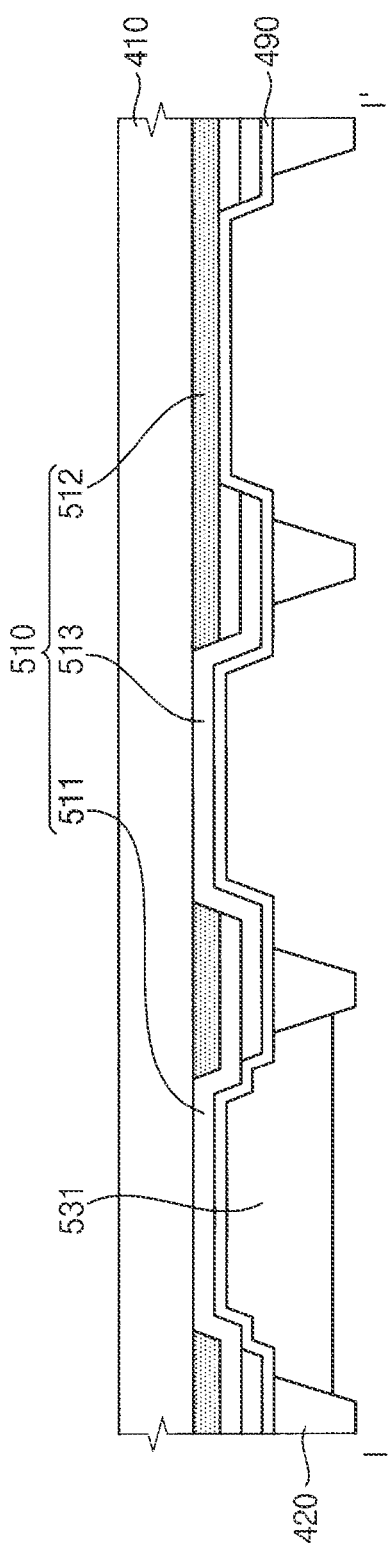

Referring to FIG. 11, a first optical filter 531 may be formed in the first opening 420a of the light blocking member 420 and on the bottom surface of the second protective insulating layer 490. The first optical filter 531 may overlap the first color filter 511. The first optical filter 531 may convert a blue light into a red light. The first optical filter 531 may include a plurality of quantum dots configured to absorb a blue light and emit a red light. The first optical filter 531 may not include any pigment having the first color, and the first optical filter 531 may be formed using an inkjet process.

Referring to FIG. 12, a third optical filter 533 may be formed in the third opening 420c of the light blocking member 420 and on the bottom surface of the second protective insulating layer 490. The third optical filter 533 may overlap the third color filter 513. The third optical filter 533 may convert a blue light into a green light. The third optical filter 533 may include a plurality of quantum dots configured to absorb a blue light and emit a green light. The third optical filter 533 may not include any pigment having the third color, and the third optical filter 533 may be formed using an inkjet process.

The quantum dots included in each of the first optical filter 531 and the third optical filter 533 may include at least one of a silicon (Si)-based nanocrystal, a group II-VI-based compound semiconductor nanocrystal, a group III-V-based compound semiconductor nanocrystal, and a group IV-VI-based compound semiconductor nanocrystal.

A first protective insulating layer 495 may be formed under/on the first optical filter 531, the third optical filter 533, the light blocking member 420, and a part of the second protective insulating layer 490. The first protective insulating layer 495 may cover the first optical filter 531, the third optical filter 533, and the light blocking member 420. The second protective insulating layer 490 and the first protective insulating layer 495 may be spaced apart from each other by each of the first optical filter 531 and the third optical filter 533; the second protective insulating layer 490 and the first protective insulating layer 495 may directly contact each other through the second opening 420b. The first protective insulating layer 495 may be formed along a profile of the first optical filter 531, the second optical filter 532, and the light blocking member 420 with a uniform thickness to cover the first optical filter 531, the second optical filter 532, and the light blocking member 420 on the bottom surface of the second protective insulating layer 490. The first protective insulating layer 495 may be formed of an inorganic insulating material such as silicon nitride.

Referring to FIG. 13, a second optical filter 532 may be formed in the second opening 420b of the light blocking member 420 and on a bottom surface of the first protective insulating layer 495. The second optical filter 532 may overlap the second color filter 512. The second optical filter 532 may be spaced apart from each of the first optical filter 531 and the third optical filter 533 by the light blocking member 420. The second optical filter 532 may transmit a blue light. The second optical filter 532 may include a scattering material for emitting/transmitting/displaying a blue light without substantially changing the wavelength of the blue light. The second optical filter 532 may not include quantum dots.

The second optical filter 532 may be formed of TiO, ZrO, $AlO_3$, $In_2O_3$, ZnO, $SnO_2$, $Sb_2O_3$, ITO, and the like.

The second optical filter 532 may further include a pigment 632 having a second color. The pigment having the second color may include C.I. pigment blue (a blue pigment) and/or a dye displaying the second color.

The intermediate layer 497 may be formed under the first protective insulating layer 495 and the second optical filter 532. The intermediate layer 497 may be formed on the bottom surface of the first protective insulating layer 495 to cover the second optical filter 532. The intermediate layer 497 may be relatively thick to sufficiently cover the second optical filter 532 on the bottom surface of the first protective insulating layer 495. The intermediate layer 497 may be formed of an organic insulating material, an inorganic insulating material, or the like.

A sealing member may be formed on an outermost periphery of the first substrate 110. The sealing member may be formed on an outermost periphery of the second substrate 410. The sealing member may be formed of a non-conductive material. The sealing member may include a frit and the like. The sealing member may additionally include a photocurable material. The sealing member may include a mixture of an organic material and a photocurable material. The photocurable material included in the sealing member may include an epoxy acrylate-based resin, a polyester acrylate-based resin, a urethane acrylate-based resin, a polybutadine acrylate-based resin, a silicon acrylate-based resin, an alkyl acrylate-based resin, and the like.

Figure 14:
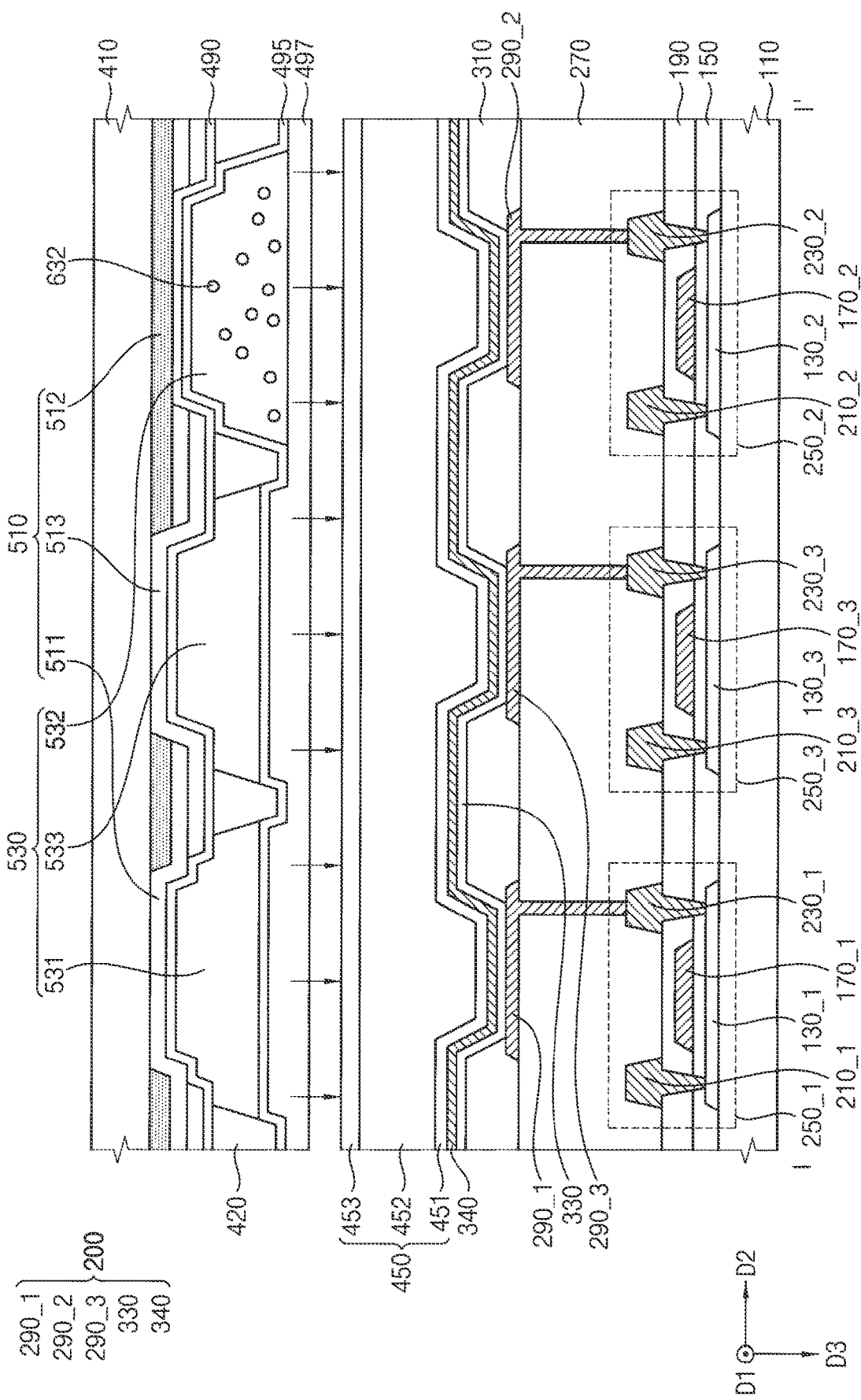

Referring to FIGS. 2 and 14, after the sealing member is formed, the bottom surface of the second substrate 410 may directly contact an upper portion of the sealing member. The lower structure 500 and the upper structure 600 may be coupled to each other.

Thereafter, the sealing member may be irradiated with an ultraviolet light, a laser light, a visible light, or the like. The sealing member may be irradiated with the laser light. Upon the irradiation with the laser light, a state of the mixture may be changed from a solid state to a liquid state, and the mixture in the liquid state may be cured back to the solid state after a predetermined time. According to the change of state of the mixture, the second substrate 410 may be coupled to the first substrate 110.

Accordingly, the display device 100 may be manufactured.

In embodiments, since the second color filter 512 having the second refractive index that is substantially equal/close to the third refractive index of the second substrate 410 is formed, the specular reflection of the display device 100 may be minimized. Since the second optical filter 532 including the pigment 632 having the second color is formed, the display device 100 may compensate for the reduced color reproduction rate of the second color. Accordingly, the display device 100 may have minimum specular reflection and may have a sufficient color reproduction rate for the second color.

Figure 15:
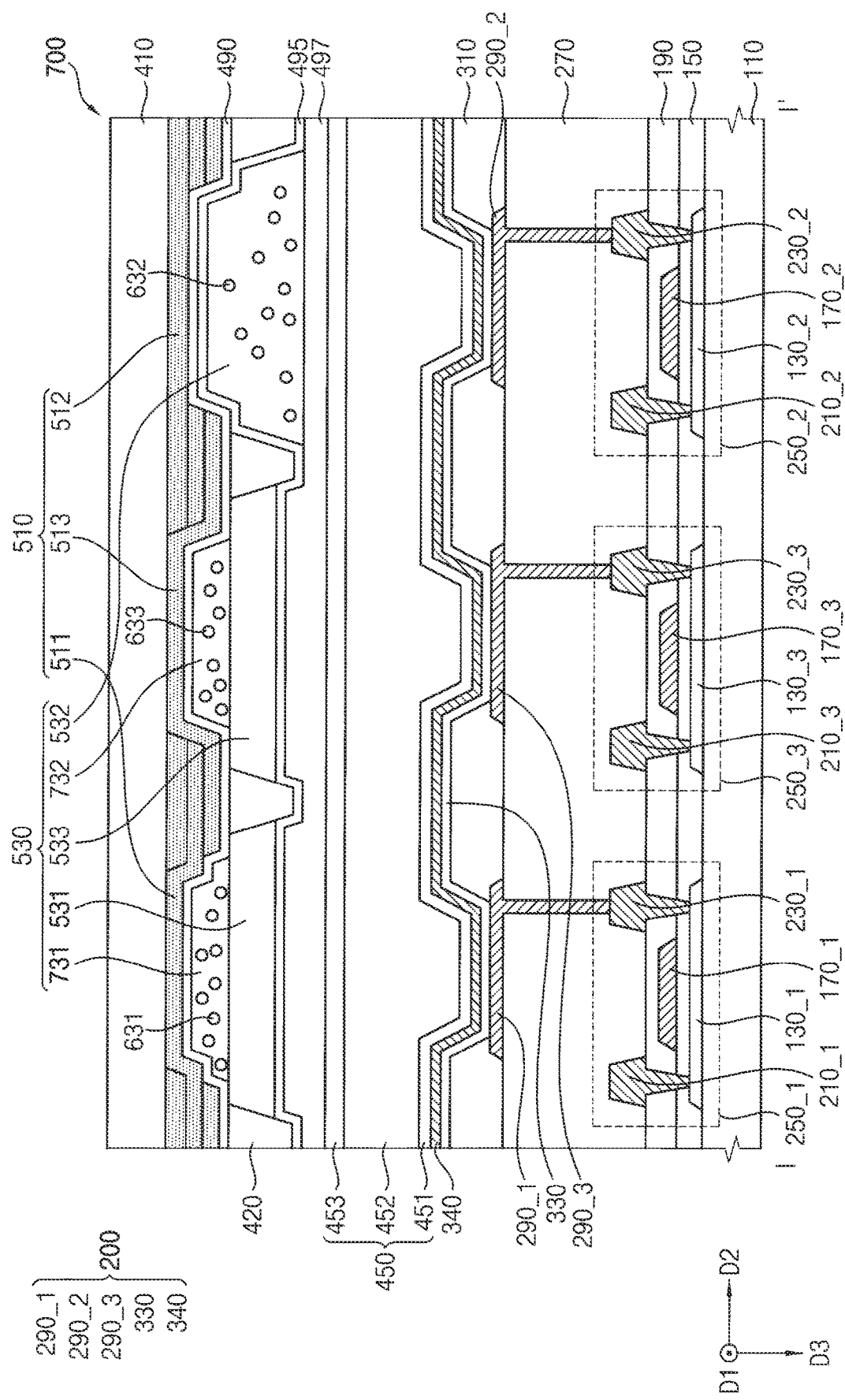
FIG. 15 is a cross-sectional view showing a display device according to embodiments.

FIG. 15 is a cross-sectional view showing a display device according to embodiments. A display device 700 illustrated in FIG. 15 may have structures and/or elements that are substantially identical or similar to structures and/or elements of the display device 100 described with reference to one or more of FIGS. 1 to 14 except for a first optical filter pattern/member 731 and a second optical filter pattern/member 732.

Figure 24:
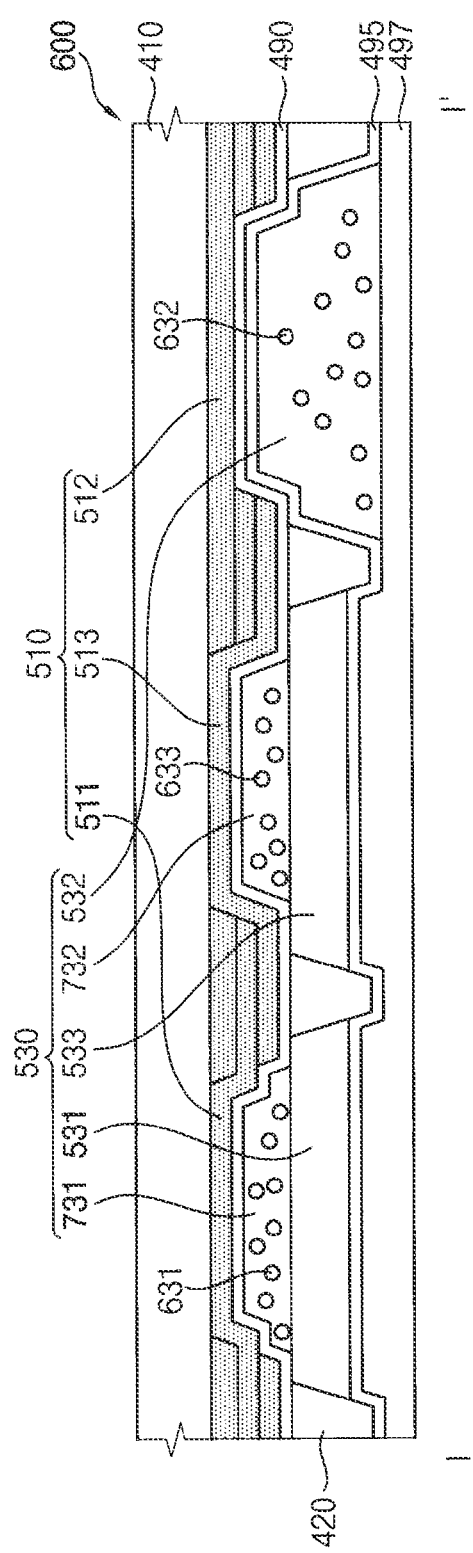

Referring to FIGS. 6, 15, and 24, the display device 700 may include a lower structure 500 and an upper structure 600.

As shown in FIGS. 6 and 15, the lower structure 500 may include a first substrate 110, a first semiconductor element 250_1, a second semiconductor element 250_2, a third semiconductor element 250_3, a gate insulating layer 150, an interlayer insulating layer 190, a planarization layer 270, a pixel structure 200, a pixel defining layer 310, a thin film encapsulation structure 450, and the like.

As shown in FIGS. 15 and 24, the upper structure 600 may include a first protective insulating layer 495, a second protective insulating layer 490, optical filters 530, an intermediate layer 497, color filters 510, a light blocking member 420, a second substrate 410, and the like. The optical filters 530 may include a first optical filter 531, a second optical filter 532, a third optical filter 533, a first optical filter pattern 731, and a second optical filter pattern 732. The color filters 510 may include a first color filter 511, a second color filter 512, and a third color filter 513.

The first color filter 511 may have a first refractive index, the second color filter 512 may have a second refractive index, the second substrate 410 may have a third refractive index, and the third color filter 513 may have a fourth refractive index. The first to fourth refractive indexes may be substantially equal or close to each other.

Referring again to FIG. 15, the second color filter 512 may be disposed on a bottom surface of the second substrate 410. The second color filter 512 may be disposed between the second substrate 410 and the second optical filter 532 and may overlap the second optical filter 532. As shown in FIG. 16, the second color filter 512 may have openings 512*a* and 512*b*. The second color filter 512 may extend in first and second directions D1 and D2. The openings 512*a* and 512*b* (first and second openings) may overlap the first optical filter 531 and the third optical filter 533 in portions in which the first optical filter 531 and the third optical filter 533 are located, respectively. The second color filter 512 may transmit a blue light (a light having the second color) and may have/display a blue color (the second color).

An amount of a pigment having the second color included in the second color filter 512 may be reduced so that the second color filter 512 may have the (predetermined) second refractive index. The pigment having the second color may include C.I. pigment blue (a blue pigment) and a dye displaying the second color.

In order to reduce specular reflection at an interface between the second substrate 410 and the second color filter 512, the third refractive index of the second substrate 410 and the second refractive index of the second color filter 512 may be configured/set such that the third and second refractive indexes may be substantially equal or close to each other. The third refractive index of the second substrate 410 may be approximately 1.52, and a refractive index of a typical color filter is in a range of approximately 1.6 to approximately 1.9. When the second color filter 512 is manufactured by relatively reducing a (predetermined) amount of the pigment, light absorptance may be reduced so that the refractive index may also be reduced. The third refractive index and the second refractive index may be substantially equal or close to each other. Accordingly, the specular reflection at the interface between the second substrate 410 and the second color filter 512 may be reduced.

Figure 17:
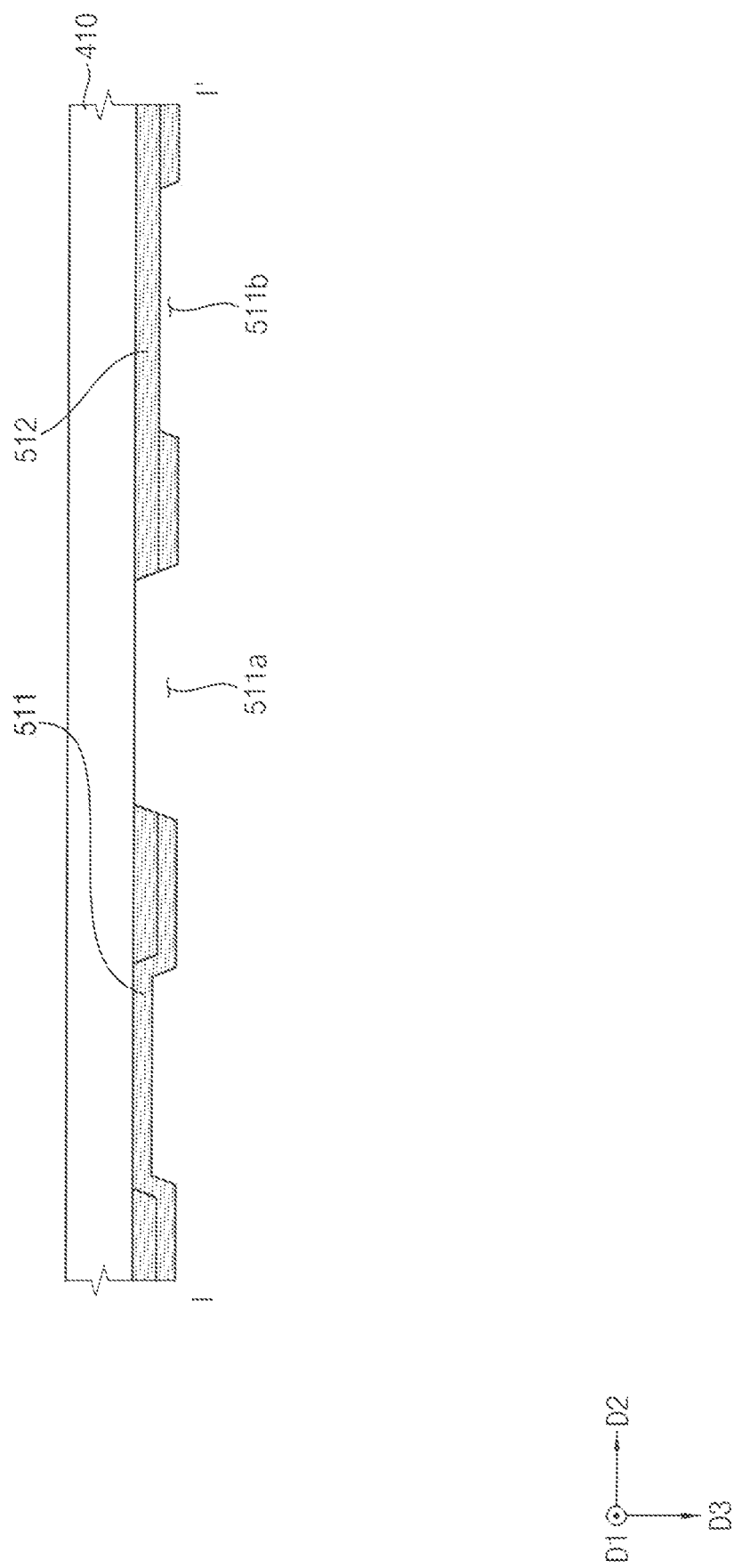

The first color filter 511 may be disposed under/on the bottom surface of the second substrate 410 and the second color filter 512. The first color filter 511 may be disposed between the second substrate 410 and the first optical filter 531 and may overlap the first optical filter 531. As shown in FIG. 17, the first color filter 511 may have openings 511*a* and 511*b* (third and fourth openings). The first color filter 511 may be disposed in the opening 512*a* (the first opening) of the second color filter 512 (or may overlap the first optical filter 531), may extend in the first and second directions D1 and D2, may include the opening 511*a* (the third opening) that exposes the opening 512*b* (the second opening) of the second color filter 512 (and overlaps the third optical filter 533), and may include the opening 511*b* (the fourth opening) that exposes a part of a bottom surface of the second color filter 512 (and overlaps the second optical filter 532). The first color filter 511 may transmit a red light (a light having a first color) and may have/display a red color (the first color).

An amount of a pigment having the first color included in the first color filter 511 may be reduced so that the first color filter 511 may have the (predetermined) first refractive index. The pigment having the first color may include C.I. pigment red (a red pigment) and a dye displaying the first/red color.

In order to reduce specular reflection at an interface between the second substrate 410 and the first color filter 511, the third refractive index of the second substrate 410 and the first refractive index of the first color filter 511 may be set/configured such that the third and first refractive indexes may be substantially equal or close to each other. When the first color filter 511 is manufactured by relatively reducing a (predetermined) amount of the pigment, light absorptance may be reduced so that the refractive index may also be reduced. The third refractive index and the first refractive index may be substantially equal or close to each other. Accordingly, the specular reflection at the interface between the second substrate 410 and the first color filter 511 may be reduced.

The third color filter 513 may be disposed under/on the bottom surface of the second substrate 410 and the first color filter 511. The third color filter 513 may be disposed between the second substrate 410 and the third optical filter 533 and may overlap the third optical filter 533. The third color filter 513 may be disposed in the opening 512*b* (the second opening) of the second color filter 512 and the opening 511*a* (the third opening) of the first color filter 511 (and may overlap the third optical filter 533), may extend in the first and second directions D1 and D2, may include a fifth opening that overlaps the first opening and exposes a part of a bottom surface of the first color filter 511 (and overlaps the first optical filter 531), and may include a sixth opening that overlaps the fourth opening and exposes the opening 511*b* (the fourth opening) of the first color filter 511 (and overlaps the second optical filter 532). The third color filter 513 may transmit a green light (a light having a third color) and may have/display a green color (the third color).

An amount of a pigment having the third color included in the third color filter 513 may be reduced so that the third color filter 513 may have the (predetermined) fourth refractive index. The pigment having the third color may include C.I. pigment green (a green pigment) and a dye displaying the third/green color.

In order to reduce specular reflection at an interface between the second substrate 410 and the third color filter 513, the third refractive index of the second substrate 410 and the fourth refractive index of the third color filter 513 may be set/configured such that the third and fourth refractive indexes may be substantially equal or close to each other. When the third color filter 513 is manufactured by relatively reducing a (predetermined) amount of the pigment, light absorptance may be reduced so that the refractive index may also be reduced. The third refractive index and the fourth refractive index may be substantially equal or close to each other. Accordingly, the specular reflection at the interface between the second substrate 410 and the third color filter 513 may be reduced.

As shown in FIG. 18, the opening 512*a* of the second color filter 512 and the fifth opening of the third color filter 513 may be defined as a first opening 510*a* of the color filters 510, the opening 511*b* of the first color filter 511 and the sixth opening of the third color filter 513 may be defined as a second opening 510*b* of the color filters 510, and the opening 512*b* of the second color filter 512 and the opening 511*a* of the first color filter 511 may be defined as a third opening 510*c* of the color filters 510.

Referring again to FIG. 15, the second protective insulating layer 490 may be disposed under/on the color filters 510. The second protective insulating layer 490 may cover the color filters 510. The second protective insulating layer 490 may be disposed along a profile of the color filters 510 with a uniform thickness to cover the color filters 510 on the bottom surface of the second substrate 410. The second protective insulating layer 490 may sufficiently cover the color filters 510 and may have a substantially flat surface without creating a step around the color filters 510.

The light blocking member 420 may be disposed on a bottom surface of the second protective insulating layer 490. The light blocking member 420 may be disposed on the pixel structure 200. As shown in FIG. 19, the light blocking member 420 may include a first opening 420a, a second opening 420b, a third opening 420c, and light blocking portions. The light blocking portions may overlap a part of the first color filter 511, a part of the second color filter 512, and a part of the third color filter 513, which define the first opening 510a, the second opening 510b, and the third opening 510c. The light blocking member 420 may have a plate shape. The first opening 510a, the second opening 510b, and the third opening 510c of the color filters 510 may overlap the first opening 420a, the second opening 420b, and the third opening 420c of the light blocking member 420, respectively.

The first optical filter pattern 731 may be disposed in the first opening 420a of the light blocking member 420 and on the bottom surface of the second protective insulating layer 490. The first optical filter pattern 731 may be disposed between the first optical filter 531 and the first color filter 511. The first optical filter pattern 731 may further include a pigment 631 having a first color. The pigment having the first color may include C.I. pigment red (a red pigment) and a dye displaying the first/red color. In order to reduce the specular reflection, the first color filter 511 may be manufactured by relatively reducing an amount of the pigment so that the first color filter 511 may have the (predetermined) first refractive index that is relatively low. However, a color reproduction rate of the first color may also be reduced. When the pigment having the first color that constitutes the first color filter 511 is reduced by a predetermined amount, the predetermined amount of the pigment having the first color may be added to the first optical filter pattern 731. The first optical filter pattern 731 may have the first color, and a reflectance of the first color may be increased by the pigment having the first color, thereby compensating for the reduced color reproduction rate of the first color. The first optical filter pattern 731 may not include the/a scattering material.

The first optical filter 531 may be disposed in the first opening 420a of the light blocking member 420 and on a bottom surface of the first optical filter pattern 731. The first optical filter 531 may be disposed on the pixel structure 200 and may overlap the first lower electrode 290_1. The first optical filter 531 may overlap the first optical filter pattern 731 and the first color filter 511. The first optical filter 531 may be spaced apart from each of the second optical filter 532 and the third optical filter 533 by light blocking portions of the light blocking member 420. The first optical filter 531 may convert a blue light into a red light. The first optical filter 531 may include a plurality of quantum dots configured to absorb a blue light and emit a red light. The first optical filter 531 may not include any pigment having the first color. If the first optical filter 531 includes the pigment having the first color, the light absorptance may be increased by the pigment having the first color. Therefore, the pigment having the first color may be added only to the first optical filter pattern 731, in order to minimize the light absorptance.

The second optical filter pattern 732 may be disposed in the third opening 420c of the light blocking member 420 and on the bottom surface of the second protective insulating layer 490. The second optical filter pattern 732 may be disposed between the third optical filter 533 and the third color filter 513. The second optical filter pattern 732 may further include a pigment 633 having a third color. The pigment having the third color may include C.I. pigment green (a green pigment) and a dye displaying the third/green color. In order to reduce the specular reflection, the third color filter 513 may be manufactured by relatively reducing an amount of the pigment so that the third color filter 513 may have the (predetermined) fourth refractive index that is relatively low. However, a color reproduction rate of the third color may also be reduced. When the pigment having the third color that constitutes the third color filter 513 is reduced by a predetermined amount, the predetermined amount of the pigment having the third color may be added to the second optical filter pattern 732. The second optical filter pattern 732 may have the third color, and a reflectance of the third color may be increased by the pigment having the third color, thereby compensating for the reduced color reproduction rate of the third color. The second optical filter pattern 732 may not include the/a scattering material.

The third optical filter 533 may be disposed in the third opening 420c of the light blocking member 420 and on a bottom surface of the second optical filter pattern 732. The third optical filter 533 may be disposed on the pixel structure 200 and may overlap the third lower electrode 290_3. The third optical filter 533 may overlap the second optical filter pattern 732 and the third color filter 513. The third optical filter 533 may be spaced apart from each of the first optical filter 531 and the second optical filter 532 by light blocking portions of the light blocking member 420. The third optical filter 533 may convert a blue light into a green light. The third optical filter 533 may include a plurality of quantum dots configured to absorb a blue light and emit a green light. The third optical filter 533 may not include any pigment having the third color. If the third optical filter 533 includes the pigment having the third color, the light absorptance may be increased by the pigment having the third color. Therefore, the pigment having the third color may be added only to the second optical filter pattern 732, in order to minimize the light absorptance.

The first protective insulating layer 495 may be disposed under/on the first optical filter 531, the third optical filter 533, the light blocking member 420, and a part of the second protective insulating layer 490. The first protective insulating layer 495 may cover the first optical filter 531, the third optical filter 533, and the light blocking member 420. The second protective insulating layer 490 and the first protective insulating layer 495 may be spaced apart from each other by each of the first optical filter 531 and the third optical filter 533, and the second protective insulating layer 490 and the first protective insulating layer 495 may directly contact each other through the second opening 420b. The first protective insulating layer 495 may be disposed inside the second opening 420b such that the first protective insulating layer 495 may not be disposed on a bottom surface of the second optical filter 532, and the first protective insulating layer 495 may not be disposed inside the first opening 420a or inside the third opening 420c such that the first protective insulating layer 495 may not be disposed on a top surface of either of the first optical filter 531 and the third optical filter 533. The first protective insulating layer 495 may be disposed along a profile of the first optical filter 531, the second optical filter 532, and the light blocking member 420 with a uniform thickness to cover the first optical filter 531, the second optical filter 532, and the light blocking member 420 on the bottom surface of the second protective insulating layer 490.

The second optical filter 532 may be disposed in the second opening 420b of the light blocking member 420 and on a bottom surface of the first protective insulating layer 495. The second optical filter 532 may be disposed on the pixel structure 200 and may overlap the second lower electrode 290_2. The second optical filter 532 may overlap the second color filter 512. The second optical filter 532 may be spaced apart from each of the first optical filter 531 and the third optical filter 533 by light blocking portions of the light blocking member 420. The second optical filter 532 may transmit a blue light.

The second optical filter 532 may further include a pigment 632 having a second color. The pigment having the second color may include C.I. pigment blue (a blue pigment) and a dye displaying the second/blue color. In order to reduce the specular reflection, the second color filter 512 may be manufactured by relatively reducing an amount of the pigment so that the second color filter 512 may have the (predetermined) second refractive index that is relatively low. However, a color reproduction rate of the second color may also be reduced. When the pigment having the second color that constitutes the second color filter 512 is reduced by a predetermined amount, the predetermined amount of the pigment having the second color may be added to the second optical filter 532. The second optical filter 532 may have the second color, and a reflectance of the second color may be increased by the pigment having the second color, thereby compensating for the reduced color reproduction rate of the second color.

Since the display device 700 according to the embodiments includes the second color filter 512 having the second refractive index, the first color filter 511 having the first refractive index, and the third color filter 513 having the fourth refractive index, in which each of the second, first, and fourth refractive indexes is substantially equal or close to the third refractive index of the second substrate 410, the specular reflection of the display device 700 may be minimized. Since the display device 700 includes the second optical filter 532 including the pigment 632 having the second color, the first optical filter pattern 731 including the pigment 631 having the first color, and the second optical filter pattern 732 including the pigment 633 having the third color, the display device 700 may compensate for the reduced color reproduction rate of the second color, the reduced color reproduction rate of the first color, and the reduced color reproduction rate of the third color. Accordingly, the display device 700 may have minimum specular reflection and may have a sufficient color reproduction rate for each of the first to third colors.

FIGS. 16 to 24 are cross-sectional views showing structures of a display device formed in a method of manufacturing the display device according to embodiments. One or more structures shown in one or more of FIGS. 16 to 24 may be inverted in one or more process steps in the manufacturing method.

A lower structure 500 may be provided with reference to FIGS. 3 to 6.

Referring to FIG. 16, a second substrate 410 may be provided. The second substrate 410 and the first substrate 110 may include substantially the same material.

A second color filter 512 may be formed on a (bottom) surface of the second substrate 410. The second color filter 512 may have openings 512a and 512b. The second color filter 512 may transmit a blue light (a light having a second color) and may have/display a blue color (the second color).

An amount of a pigment having the second color included in the second color filter 512 may be reduced so that the second color filter 512 may have a (predetermined) second refractive index. The second color filter 512 having the second refractive index may be manufactured by relatively reducing the pigment (by a predetermined amount). Accordingly, a third refractive index of the second substrate 410 and the second refractive index of the second color filter 512 may be substantially equal or close to each other. The pigment having the second color may include C.I. pigment blue (a blue pigment) and/or a dye displaying the second/blue color.

Referring to FIG. 17, a first color filter 511 may be formed under/on the second substrate 410 and the second color filter 512. The first color filter 511 may have openings 511a and 511b. The first color filter 511 may transmit a red light (a light having a first color) and may have/display a red color (the first color).

An amount of a pigment having the first color included in the first color filter 511 may be reduced so that the first color filter 511 may have a (predetermined) first refractive index. The first color filter 511 having the first refractive index may be manufactured by relatively reducing the pigment (by a predetermined amount). Accordingly, the third refractive index of the second substrate 410 and the first refractive index of the first color filter 511 may be substantially equal or close to each other. The pigment having the first color may include C.I. pigment red and/or a dye displaying the first/red color.

Referring to FIG. 18, a third color filter 513 may be formed under/on the second substrate 410 and the first color filter 511. The third color filter 513 may have a sixth opening that exposes the opening 511b of the first color filter 511 and may have a fifth opening that exposes a part of a bottom surface of the first color filter 511. The third color filter 513 may transmit a green light and may have/display a green color.

An amount of a pigment having the third color included in the third color filter 513 may be reduced so that the third color filter 513 may have a (predetermined) fourth refractive index. The third color filter 513 having the fourth refractive index may be manufactured by relatively reducing the pigment (by a predetermined amount). Accordingly, the third refractive index of the second substrate 410 and the fourth refractive index of the third color filter 513 may be substantially equal or close to each other. The pigment having the third color may include C.I. pigment green and/or a dye displaying the third/green color.

The opening 512a of the second color filter 512 and the fifth opening of the third color filter 513 may be defined as a first opening 510a of the color filters 510, the opening 511b of the first color filter 511 and the sixth opening of the third color filter 513 may be defined as a second opening 510b of the color filters 510, and the opening 512b of the second color filter 512 and the opening 511a of the first color filter 511 may be defined as a third opening 510c of the color filters 510.

Referring to FIG. 19, a second protective insulating layer 490 may be formed under/on the color filters 510. The second protective insulating layer 490 may cover the color filters 510. The second protective insulating layer 490 may be formed along a profile of the color filters 510 with a uniform thickness to cover the color filters 510.

A light blocking member 420 may be formed on a bottom surface of the second protective insulating layer 490. The light blocking member 420 may have a first opening 420a, a second opening 420b, and a third opening 420c. The light blocking member 420 may have a plate shape. The first opening 510a, the second opening 510b, and the third opening 510c of the color filters 510 may overlap the first opening 420a, the second opening 420b, and the third opening 420c of the light blocking member 420, respectively.

Figure 20:
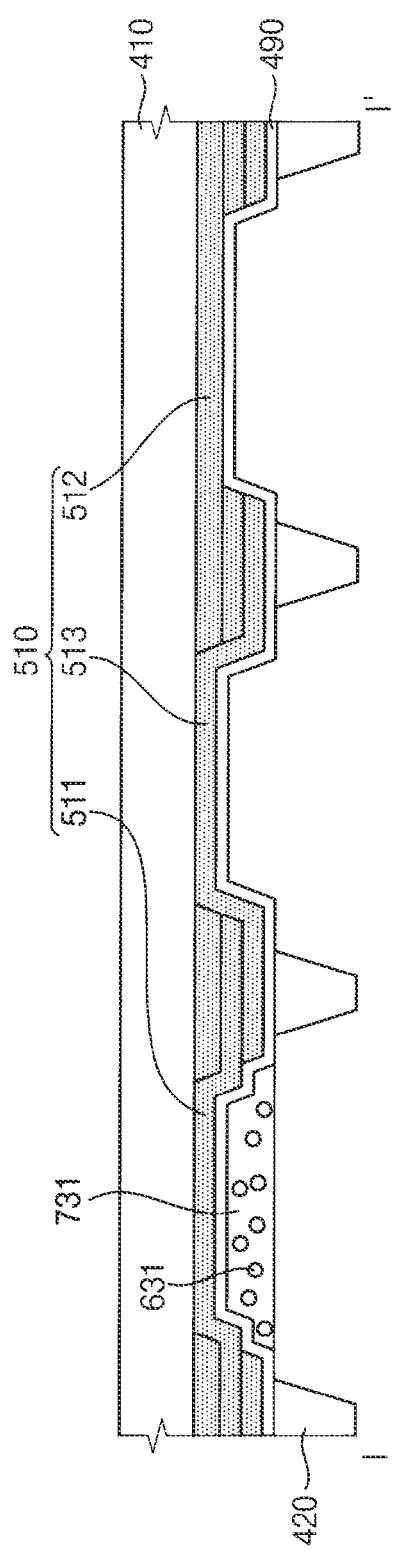

Referring to FIG. 20, a first optical filter pattern 731 may be formed in the first opening 420a of the light blocking member 420 and on the bottom surface of the second protective insulating layer 490. The first optical filter pattern 731 may include a pigment 631 having a first color. The pigment having the first color may include C.I. pigment red and/or a dye displaying the first/red color.

Referring to FIG. 21, a first optical filter 531 may be formed in the first opening 420a of the light blocking member 420 and on a bottom surface of the first optical filter pattern 731. The first optical filter 531 may overlap the first optical filter pattern 731 and the first color filter 511. The first optical filter 531 may convert a blue light into a red light. The first optical filter 531 may include a plurality of quantum dots configured to absorb a blue light and emit a red light. The first optical filter 531 may not include any pigment having the first color.

Figure 22:
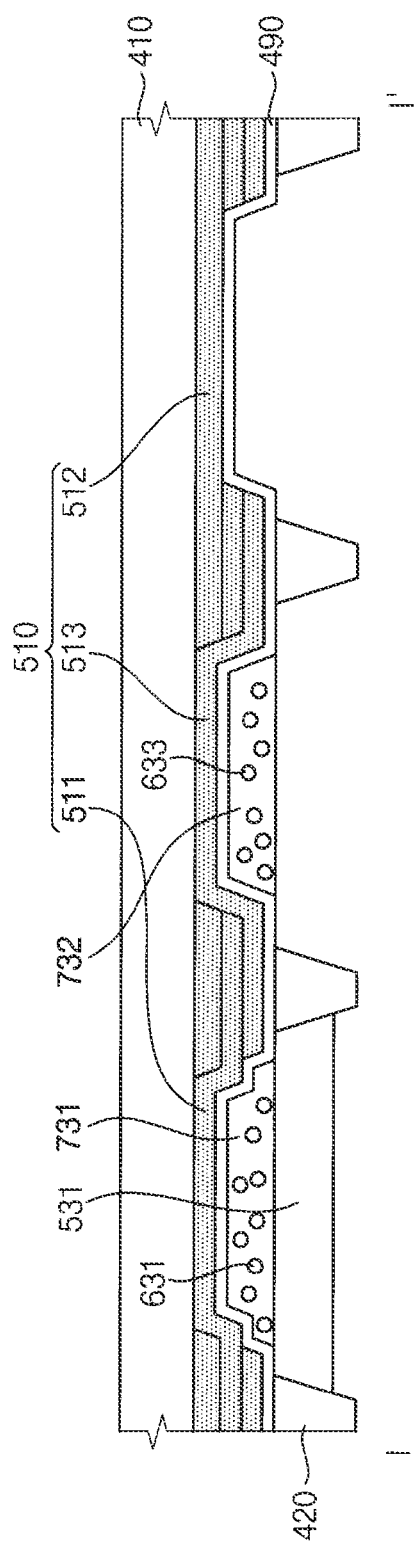

Referring to FIG. 22, a second optical filter pattern 732 may be formed in the third opening 420c of the light blocking member 420 and on the bottom surface of the second protective insulating layer 490. The second optical filter pattern 732 may include a pigment 633 having a third color. The pigment having the third color may include C.I. pigment green and a dye displaying the third/green color.

Referring to FIG. 23, a third optical filter 533 may be formed in the third opening 420c of the light blocking member 420 and on a bottom surface of the second optical filter pattern 732. The third optical filter 533 may overlap the second optical filter pattern 732 and the third color filter 513. The third optical filter 533 may convert a blue light into a green light. The third optical filter 533 may include a plurality of quantum dots configured to absorb a blue light and emit a green light. The third optical filter 533 may not include any pigment having the third color.

The first protective insulating layer 495 may be formed under/on the first optical filter 531, the third optical filter 533, the light blocking member 420, and a part of the second protective insulating layer 490.

Referring to FIG. 24, a second optical filter 532 may be formed in the second opening 420b of the light blocking member 420 and on a bottom surface of the first protective insulating layer 495. The second optical filter 532 may overlap the second color filter 512. The second optical filter 532 may transmit a blue light.

The second optical filter 532 may include a pigment 632 having a second color. The pigment having the second color may be formed by using C.I. pigment blue and a dye displaying the second/blue color.

The intermediate layer 497 may be formed under/on the first protective insulating layer 495 and the second optical filter 532.

Accordingly, an upper structure 600 may be formed and subsequently combined with the lower structure 500 to form the display device 700 shown in FIG. 15.

Since each of the refractive indexes of the color filters is substantially equal or close to the refractive index of the second substrate 410, the specular reflection of the display device 700 may be minimized. Since the second optical filter 532 includes the pigment 632 having the second color, the first optical filter pattern 731 includes the pigment 631 having the first color, and the second optical filter pattern 732 includes the pigment 633 having the third color, the display device 700 may compensate for the reduced color reproduction rates for the second color, the first color, and the third color. Advantageously, the display device 700 may have minimum specular reflection and may have desirable color reproduction rates for each of the first to third colors.

Embodiments may be applied to various electronic devices including a display device. The electronic devices may include vehicle-display devices, ship-display devices, aircraft-display devices, portable communication devices, medical-display devices, etc.

The foregoing is illustrative of embodiments and is not to be construed as limiting. Although a few embodiments have been described, many modifications are possible in the embodiments without materially departing from the scope of the appended claims.

What is claimed is:

1. A display device comprising:
   a first substrate;
   a pixel structure disposed on the first substrate;
   a first optical filter disposed on the pixel structure;
   a first color filter disposed on the first optical filter, having a first color, and having a first refractive index;
   a second optical filter disposed on the pixel structure, spaced from the first optical filter, and including a pigment having a second color;
   a second color filter disposed on the second optical filter, having the second color, and having a second refractive index; and
   a second substrate disposed on the first color filter and the second color filter,
   wherein the second substrate has a third refractive index, and
   wherein a difference between the third refractive index and the second refractive index is less than a difference between the third refractive index and the first refractive index color,
   wherein at least one end of the first color filter overlaps at least one end of the second color filter to form an overlapping portion, and
   wherein a light blocking member is disposed between the overlapping portion and the pixel structure.

2. The display device of claim 1, wherein the second color is a blue color.

3. The display device of claim 1, wherein the second optical filter displays the second color, and wherein the first optical filter does not include any pigment having the first color.

4. The display device of claim 1, wherein each of the first refractive index and the second refractive index is greater than the third refractive index.

5. The display device of claim 1, wherein the pigment having the second color includes a blue pigment and a dye having the second color.

6. The display device of claim 1, further comprising:
   a third optical filter disposed on the pixel structure and spaced from each of the first optical filter and the second optical filter; and
   a third color filter disposed on the third optical filter, having a third color, and having a fourth refractive index.

7. The display device of claim 6, wherein the fourth refractive index is greater than the third refractive index, and wherein the fourth refractive index is greater than the second refractive index.

8. The display device of claim 6, wherein the second optical filter is configured to transmit a first part of light of the second color, wherein the first optical filter is configured to convert a second part of the light of the second color into light of the first color, and wherein the third optical filter is configured to convert a third part of the light of the second color into light of the third color.

9. The display device of claim 6, further comprising a light blocking member disposed on the pixel structure, wherein the light blocking member includes a first hole, a second hole, and a third hole, wherein the first optical filter is at least partially disposed in the first hole, wherein the second optical filter is at least partially disposed in the second hole, and wherein the third optical filter is at least partially disposed in the third hole.

10. The display device of claim 6, wherein the pixel structure includes:
 a first pixel electrode disposed between the first optical filter and the first substrate;
 a second pixel electrode disposed between the second optical filter and the first substrate;
 a third pixel electrode disposed between the third optical filter and the first substrate;
 a light emitting layer disposed on the first pixel electrode, the second pixel electrode, and the third pixel electrode; and
 a common electrode disposed on the light emitting layer.

11. The display device of claim 10, wherein the second substrate is disposed directly on the first color filter, the second color filter, and the third color filter.

12. The display device of claim 11, wherein the second color filter overlaps the second optical filter and includes a first opening and a second opening, and wherein the first opening and second opening respectively expose a first surface portion of the second substrate and a second surface portion of the second substrate that overlap the first optical filter and the third optical filter, respectively.

13. The display device of claim 12, wherein the first color filter is partially disposed in the first opening and includes a third opening and a fourth opening, wherein the third opening exposes a portion of the third optical filter that overlaps the second surface portion of the second substrate, and wherein the fourth opening exposes a surface portion of the second color filter that overlaps the second optical filter.

14. The display device of claim 13, wherein the third color filter is partially disposed in the second opening, is partially disposed in the third opening, and includes a fifth opening and a sixth opening, wherein the fifth opening exposes a portion of the first optical filter that overlaps the first surface portion of the second substrate, and wherein the sixth opening exposes a portion of the second optical filter that overlaps the surface portion of the second color filter.

15. The display device of claim 1, wherein the pixel structure is configured to emit a light having the second color.

16. A display device comprising:
 a first substrate;
 a pixel structure disposed on the first substrate;
 a first optical filter disposed on the pixel structure;
 a first color filter overlapping the first optical filter and having a first color;
 a first optical filter member disposed between the first optical filter and the first color filter and including a pigment having the first color;
 a second optical filter disposed on the pixel structure, spaced apart from the first optical filter, and including a pigment having a second color; and
 a second color filter disposed on the second optical filter and having the second color,
 wherein at least one end of the first color filter overlaps at least one end of the second color filter to form an overlapping portion, and
 wherein a light blocking member is disposed between the overlapping portion and the pixel structure.

17. The display device of claim 16, further comprising:
 a third optical filter disposed on the pixel structure and spaced from each of the first optical filter and the second optical filter;
 a third color filter overlapping the third optical filter and having a third color; and
 a second optical filter member disposed between the third optical filter and the third color filter and including a pigment having the third color, wherein the first optical filter member displays the first color, wherein the second optical filter member displays the third color, and wherein the second optical filter displays the second color.

18. The display device of claim 17, further comprising a light blocking member disposed on the pixel structure, wherein the light blocking member includes a first hole, a second hole, and a third hole, wherein the first optical filter member is at least partially disposed in the first hole, wherein the second optical filter is at least partially disposed in the second hole, and wherein the second optical filter member is at least partially disposed in the third hole.

19. The display device of claim 17, further comprising a second substrate disposed on the first color filter, the second color filter, and the third color filter, wherein the second color filter overlaps the second optical filter and includes a first opening and a second opening, wherein the first opening and the second opening respectively expose a first surface portion of the second substrate and a second surface portion of the second substrate that overlap the first optical filter and the third optical filter, respectively, wherein the first color filter is partially disposed in the first opening and includes a third opening and a fourth opening, wherein the third opening exposes a surface portion of the second color filter that overlaps the second optical filter, wherein the fourth opening exposes a portion of the third optical filter that overlaps the second surface portion of the second substrate, wherein the third color filter is partially disposed in the second opening, partially disposed in the fourth opening, and includes a fifth opening and a sixth opening, wherein the fifth opening exposes a portion of the first optical filter that overlaps the first surface portion of the second substrate, and wherein the sixth opening exposes a portion of the second optical filter that overlaps the surface portion of the second color filter.

20. The display device of claim 17, wherein at least one of the pigment having the second color, the pigment having the first color, and the pigment having the third color includes a least a dye having at least one of the first color, the second color, and the third color.

21. A display device comprising:
 a first substrate;
 a pixel structure disposed on the first substrate;
 a first optical filter disposed on the pixel structure;
 a first color filter disposed on the first optical filter, having a first color, and having a first refractive index;
 a second optical filter disposed on the pixel structure, spaced from the first optical filter, and including a pigment having a second color;
 a second color filter disposed on the second optical filter, having the second color, and having a second refractive index;
 a third optical filter disposed on the pixel structure, and spaced from the first optical filter and the second optical filter;
 a third color filter disposed on the third optical filter, and having a third color;

a second substrate disposed on the first color filter and the second color filter; and an overlapping portion disposed between the pixel structure and the second substrate, and comprising a part of the second color filter directly contacting the second substrate, a part of the first color filter overlapping the part of the second color filter, and a part of the third color filter overlapping the part of the first color filter, wherein the second substrate has a third refractive index, wherein a difference between the third refractive index and the second refractive index is less than a difference between the third refractive index and the first refractive index color, and wherein the second refractive index of the second color filter approximates or is substantially equal to the third refractive index of the second substrate.

22. A display device comprising:

a first substrate;

a pixel structure disposed on the first substrate;

a first optical filter disposed on the pixel structure;

a first color filter overlapping the first optical filter and having a first color;

a first optical filter member disposed between the first optical filter and the first color filter and including a pigment having the first color;

a second optical filter disposed on the pixel structure, spaced apart form the first optical filter, and including a pigment having a second color;

a second color filter disposed on the second optical filter and having the second color;

a third optical filter disposed on the pixel structure, and spaced from the first optical filter and the second optical filter;

a third color filter disposed on the third optical filter, and having a third color;

a second substrate disposed on the first color filter and the second color filter; and an overlapping portion disposed between the pixel structure and the substrate, and comprising a part of the second color filter directly contacting the second substrate, a part of the first color filter overlapping the part of the second color filter, and a part of the third color filter overlapping the part of the first color filter, wherein a refractive index of the second color filter approximates or is substantially equal to a reflective index of the second substrate.

* * * * *